United States Patent
Shibata et al.

(10) Patent No.: US 7,501,685 B2
(45) Date of Patent: *Mar. 10, 2009

(54) DISPLAY DEVICE COMPRISING PIXEL PORTION

(75) Inventors: Hiroshi Shibata, Yamagata (JP); Atsuo Isobe, Kanagawa (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 301 days.

This patent is subject to a terminal disclaimer.

(21) Appl. No.: 11/091,583

(22) Filed: Mar. 29, 2005

(65) Prior Publication Data

US 2005/0167674 A1  Aug. 4, 2005

Related U.S. Application Data

(62) Division of application No. 10/456,503, filed on Jun. 9, 2003, now Pat. No. 7,098,086, which is a division of application No. 09/653,535, filed on Aug. 31, 2000, now Pat. No. 6,583,472.

(30) Foreign Application Priority Data

Aug. 31, 1999 (JP) ................................ 11-246798

(51) Int. Cl.
  *H01L 27/01* (2006.01)
  *H01L 27/12* (2006.01)
  *H01L 31/0392* (2006.01)

(52) U.S. Cl. .......................... 257/350; 257/59; 257/72; 257/435; 257/E27.014

(58) Field of Classification Search .................. 257/59, 257/72, 350, 435, E27.014
See application file for complete search history.

(56) References Cited

U.S. PATENT DOCUMENTS 5,233,211 A   8/1993  Hayashi et al.

(Continued)

FOREIGN PATENT DOCUMENTS

EP         0 450 941         10/1991

(Continued)

OTHER PUBLICATIONS

European Search Report for Application No. 05008809.5—dated Aug. 9, 2005.

(Continued)

*Primary Examiner*—Ngan Ngo
(74) *Attorney, Agent, or Firm*—Nixon Peabody LLP; Jeffrey L. Costellia

(57) ABSTRACT

To provide a liquid crystal display device having high quality display by obtaining a high aperture ratio while securing a sufficient storage capacitor (Cs), and at the same time, by dispersing a load (a pixel writing-in electric current) of a capacitor wiring in a timely manner to effectively reduce the load. A scanning line is formed on a different layer from a gate electrode and the capacitor wiring is arranged so as to be parallel with a signal line. Each pixel is connected to the individually independent capacitor wiring via a dielectric. Therefore, variations in the electric potential of the capacitor wiring caused by a writing-in electric current of a neighboring pixel can be avoided, whereby obtaining satisfactory display images.

24 Claims, 19 Drawing Sheets

B-B' cross sectional view

U.S. PATENT DOCUMENTS

| | | | |
|---|---|---|---|
| 5,614,730 | A | 3/1997 | Nakazawa et al. |
| 5,672,518 | A | 9/1997 | Hayashi et al. |
| 5,759,878 | A | 6/1998 | Hayashi et al. |
| 5,818,552 | A | 10/1998 | Sato |
| 5,889,302 | A | 3/1999 | Liu |
| 5,917,563 | A | 6/1999 | Matsushima |
| 5,926,699 | A | 7/1999 | Hayashi et al. |
| 6,040,200 | A | 3/2000 | Hayashi et al. |
| 6,067,131 | A | 5/2000 | Sato |
| RE36,836 | E | 8/2000 | Hayashi et al. |
| 6,141,066 | A | 10/2000 | Matsushima |
| 6,252,248 | B1 | 6/2001 | Sano et al. |
| 6,327,006 | B1 | 12/2001 | Sato et al. |
| 6,359,665 | B1 | 3/2002 | Matsushima |
| 6,380,561 | B1 | 4/2002 | Ohtani et al. |
| 6,392,255 | B1 | 5/2002 | Shibata et al. |
| 6,576,926 | B1 | 6/2003 | Yamazaki et al. |
| 6,583,472 | B1 * | 6/2003 | Shibata et al. ............... 257/350 |
| 6,624,012 | B2 | 9/2003 | Shibata et al. |
| 6,806,932 | B2 | 10/2004 | Matsushima |
| 6,998,299 | B2 | 2/2006 | Shibata et al. |
| 7,057,691 | B2 | 6/2006 | Matsushima |
| 7,190,418 | B2 | 3/2007 | Matsushima |
| 7,282,737 | B2 | 10/2007 | Shibata et al. |
| 2002/0057248 | A1 | 5/2002 | Matsushima |
| 2004/0201788 | A1 | 10/2004 | Matsushima |
| 2006/0194375 | A1 | 8/2006 | Shibata et al. |
| 2008/0036935 | A1 | 2/2008 | Shibata et al. |

FOREIGN PATENT DOCUMENTS

| | | |
|---|---|---|
| EP | 0 481 734 A2 | 4/1992 |
| EP | 0 484 965 A2 | 5/1992 |
| EP | 0 762 180 A1 | 3/1997 |
| EP | 0 997 769 | 5/2000 |
| JP | 59-121876 | 7/1984 |
| JP | 02-234128 | 9/1990 |
| JP | 03-080225 | 4/1991 |
| JP | 04-307521 | 10/1992 |
| JP | 05-027266 | 2/1993 |
| JP | 07-028093 | 1/1995 |
| JP | 08-78329 | 3/1996 |
| JP | 08-078329 | 3/1996 |
| JP | 2556252 | 11/1996 |
| JP | 09-160074 | 6/1997 |
| JP | 09-292626 | 11/1997 |
| JP | 09-043639 | 12/1997 |
| JP | 10-189999 | 7/1998 |
| JP | 2000-131716 | 5/2000 |
| KR | 10-0238640 | 10/1999 |

OTHER PUBLICATIONS

U.S. Appl. No. 10/123,520, filed Apr. 17, 2002 "Semiconductor Device" (Specification, Claims and Drawings).

European Search Report, Dec. 9, 2000, 4 pages.

Yoo et al., "Pixel Design for TFT-LCD with Double Gate Poly-Si TFT and Double Layer Storage Capacitor", 1997, pp. 219-222, School of Electrical Engineering, Seoul National University, Seoul, Korea, Samsung Electronics Co., Ltd. Korea.

Hirai et al., "A High-Aperature-Ratio a-Si TFT Liquid Crystal Light Valve for Workstations", Apr. 1994, pp. 165-170, 298 NED Research & Development 35, No. 2, Tokyo, Japan.

Kumar et al., "Kink-free Polycrystalline Silicon Double-Gate Elevated-Channel Thin-Film Transistors", Dec. 1998, pp. 2514-2520, IEEE Transactions on Electron Devices; vol. 45, No. 1.

Specifications and drawings for U.S. Appl. No. 09/671,780, "Semiconductor Device and Method of Manufacturing Thereof", filed Sep. 27, 2000, pp. 1-42 plus drawings, Hiroshi Shibata et al.

Office Action from Chinese Patent Office in counterpart Chinese Patent Application No. 200510067389.2, dated Mar. 14, 2008.

Office Action dated Nov. 21, 2008, in counterpart Chinese Patent Application No. 200710182288.9, with English translation.

* cited by examiner

Fig. 3A  A-A' cross sectional view
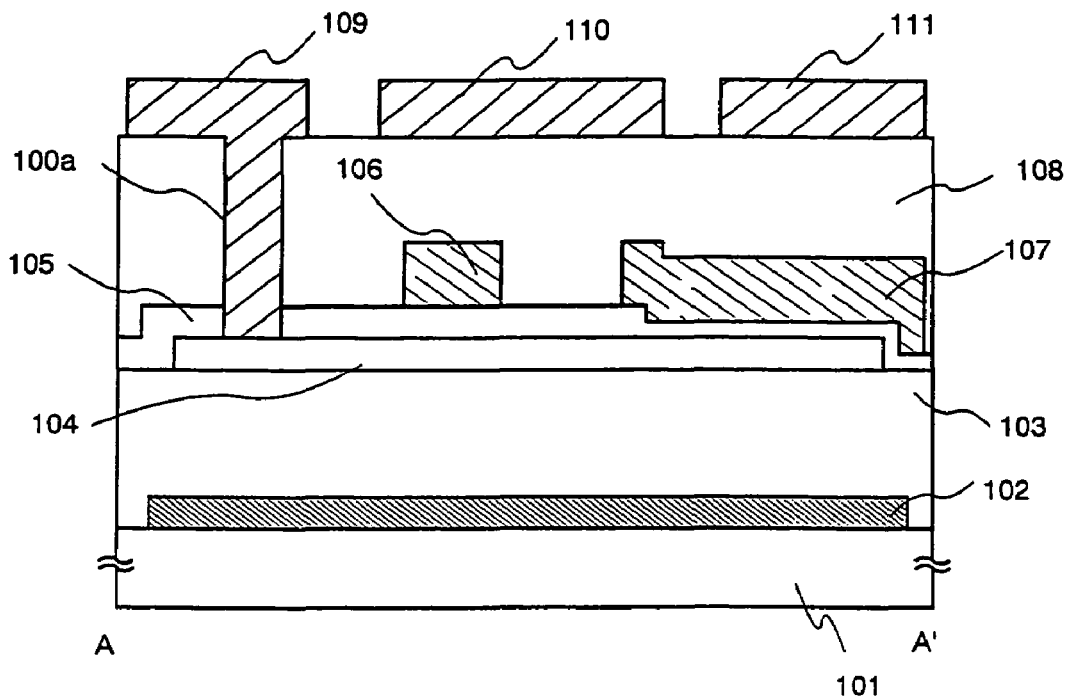
Fig. 3B  B-B' cross sectional view
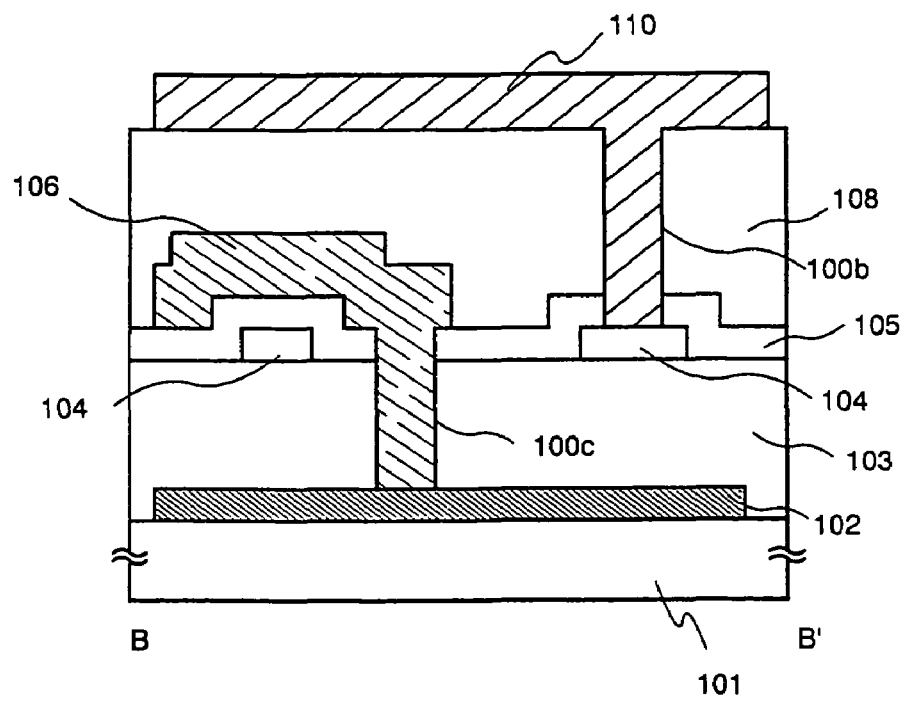

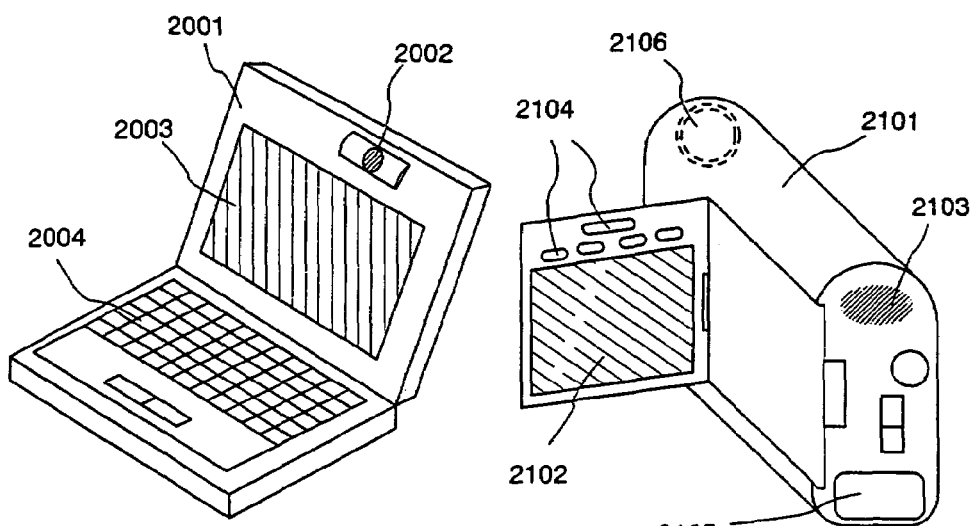
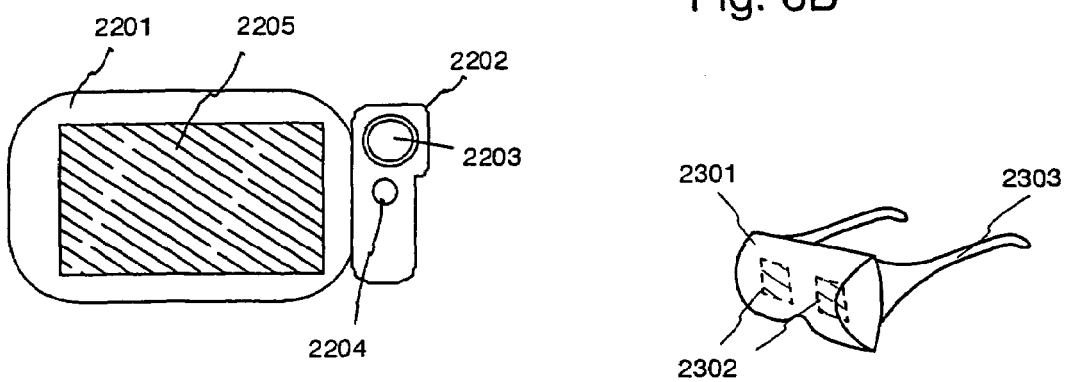
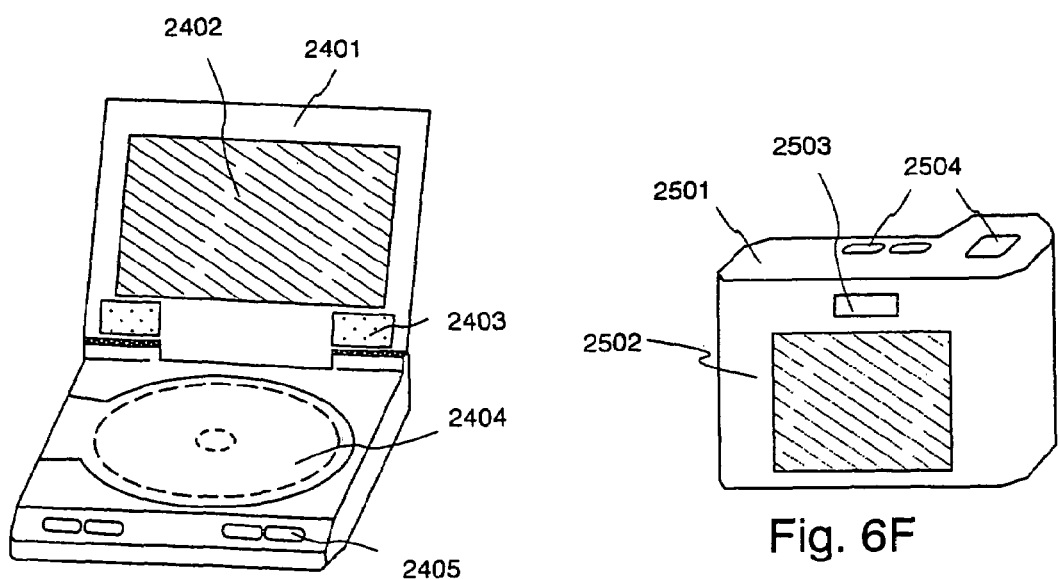
Fig. 6A
Fig. 6B
Fig. 6C
Fig. 6D
Fig. 6E
Fig. 6F

Fig. 8C(1) 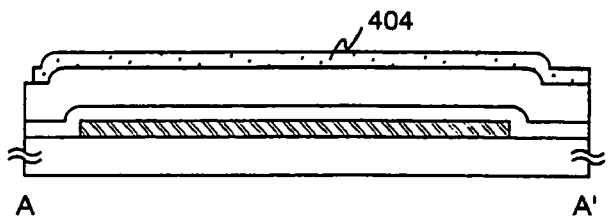
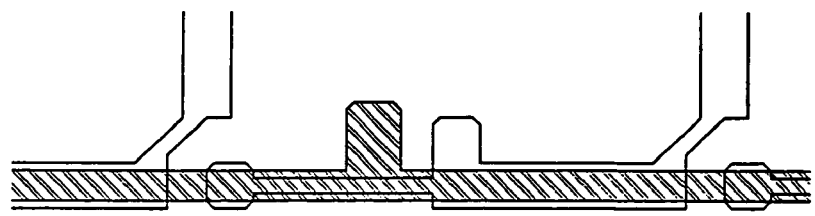
Fig. 8C(2) 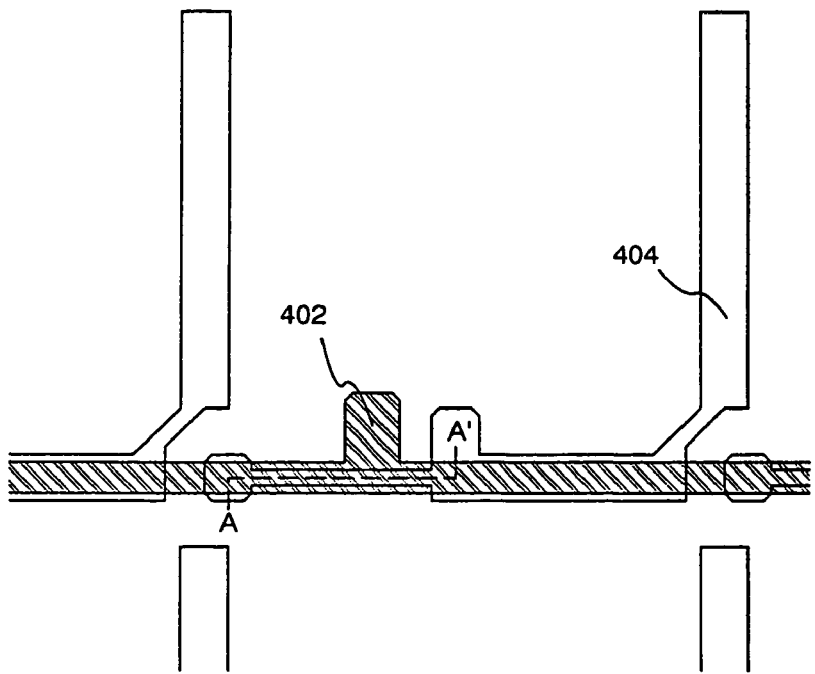

Fig. 9C(1) 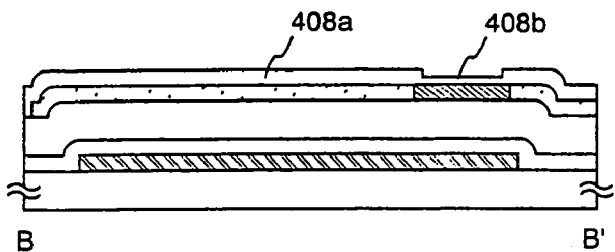
Fig. 9C(2) 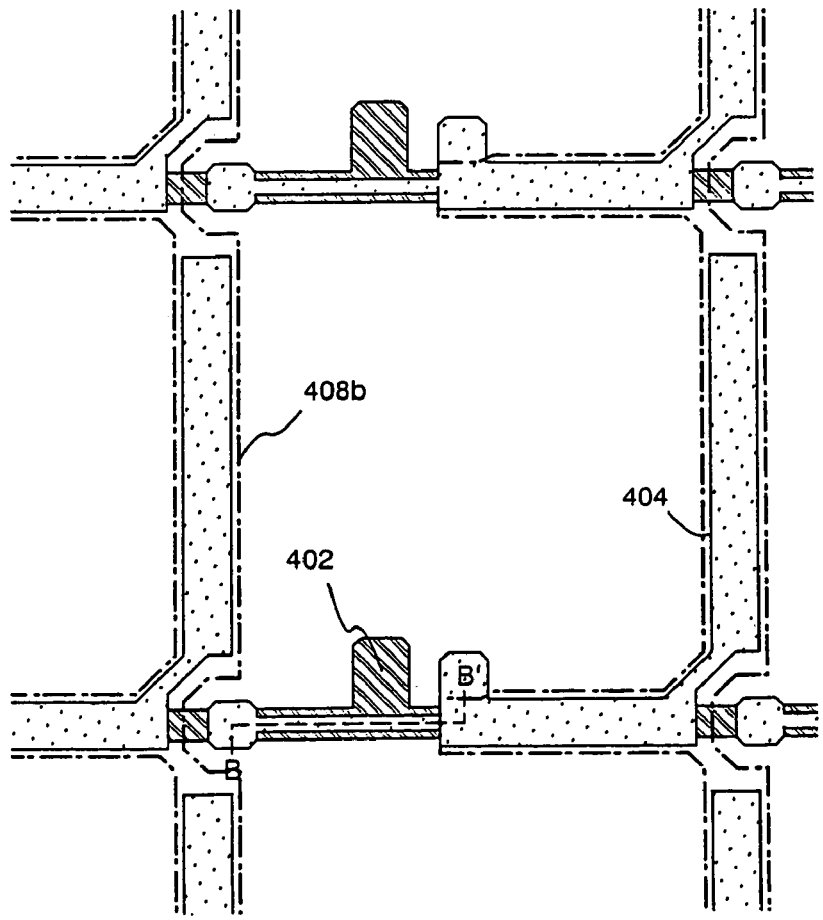

Fig. 10A
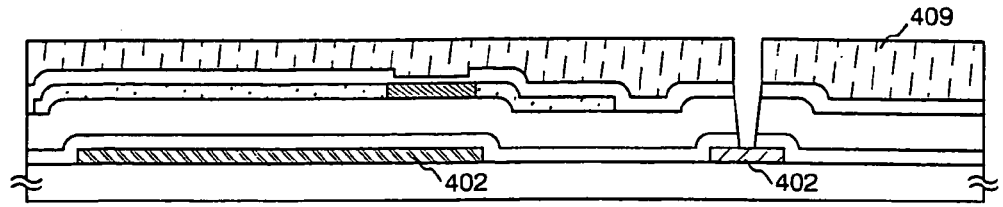
Fig. 10B
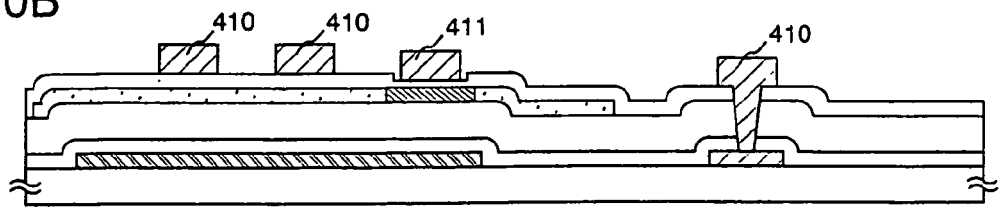
Fig. 10C(1)
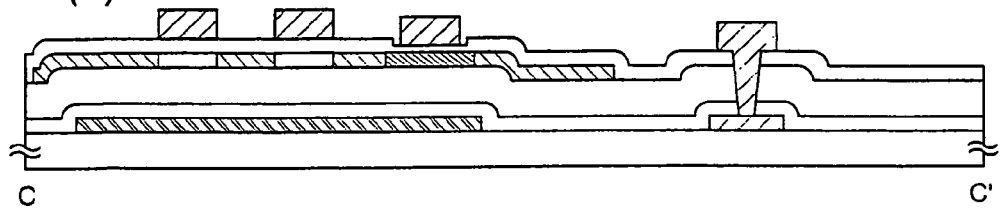
Fig. 10C(2)
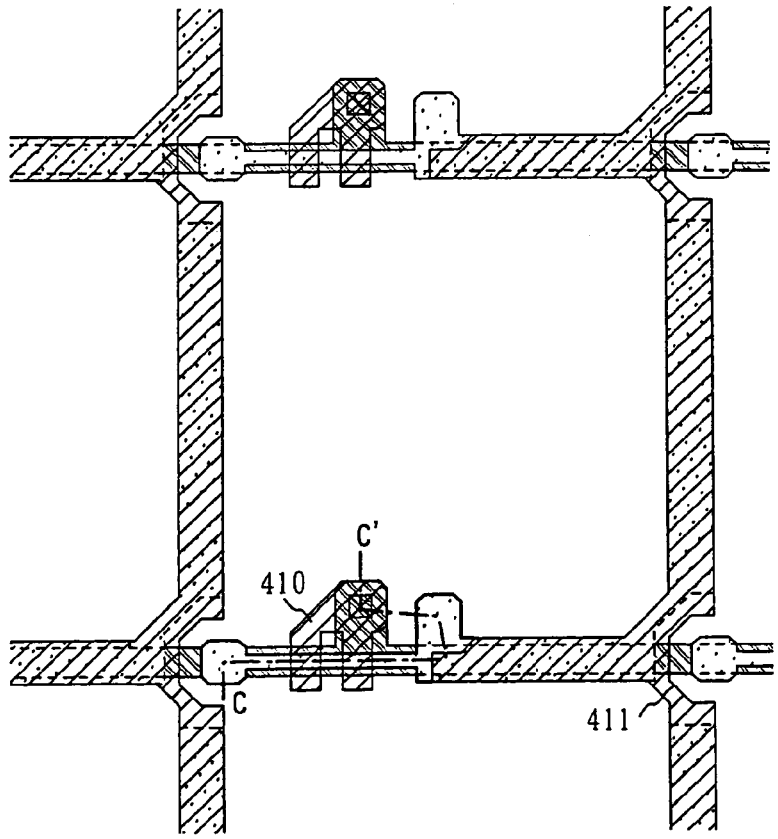

Fig. 11A
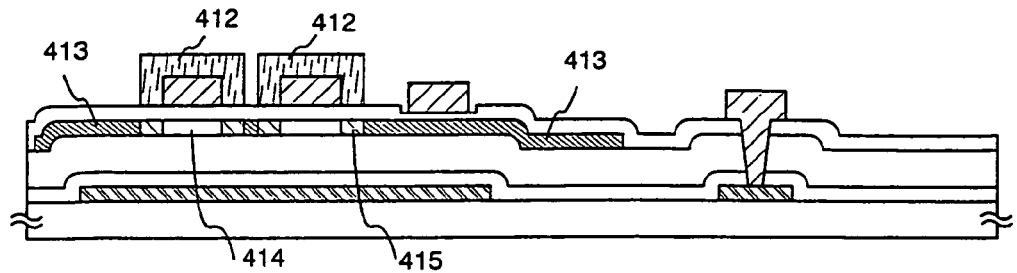
Fig. 11B(1)
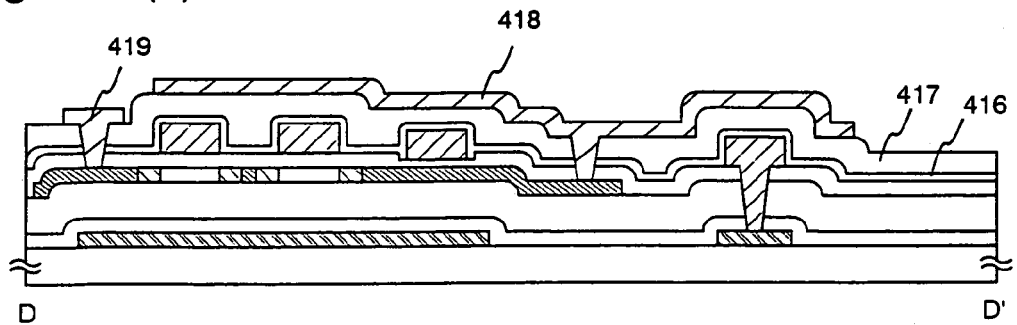
Fig. 11B(2)
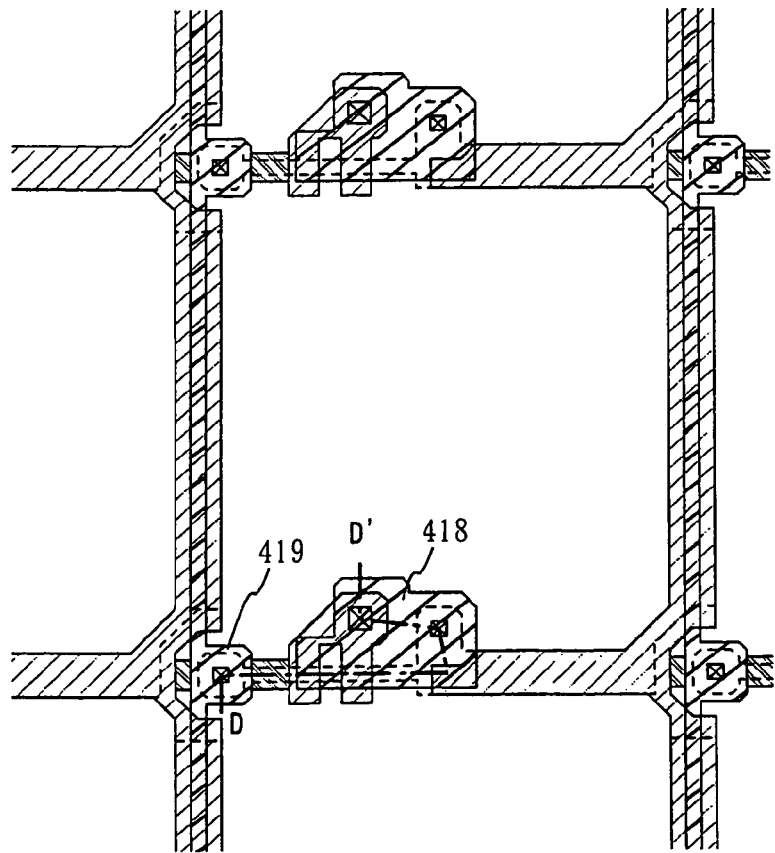

Fig. 12A(1)
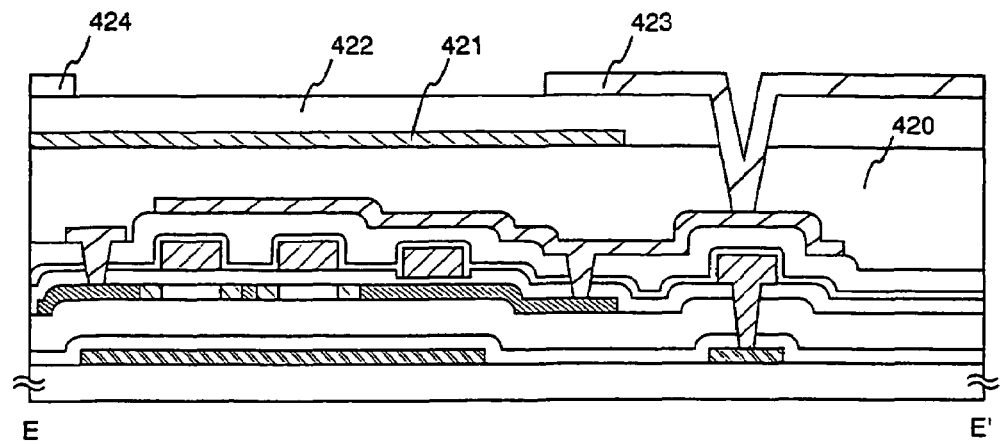
Fig. 12A(2)
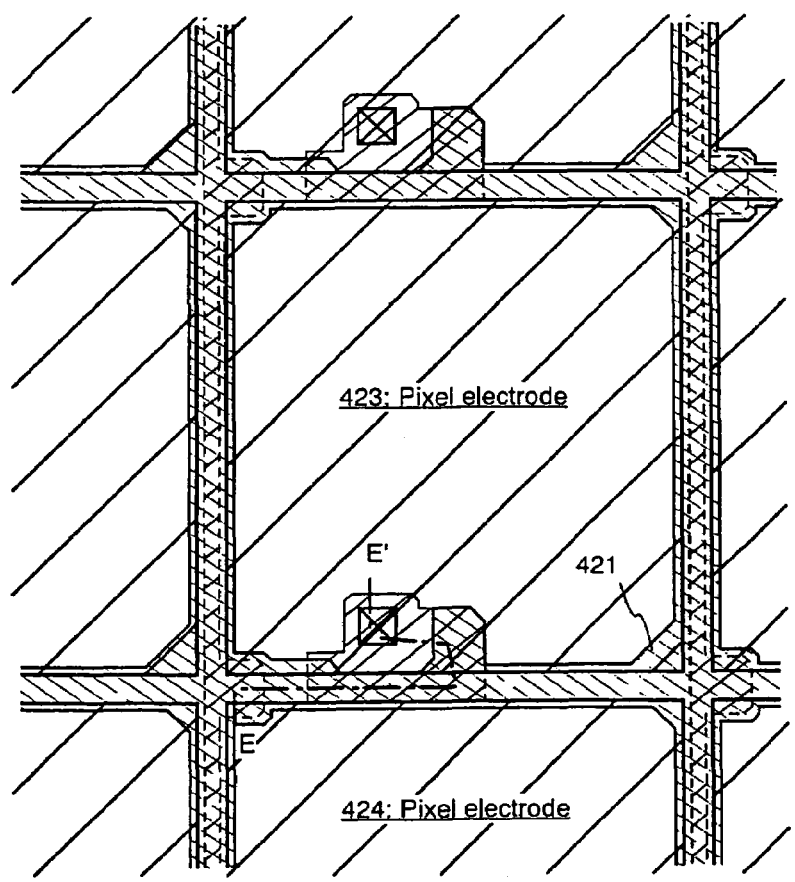

Fig. 15A  A-A' Cross sectional view
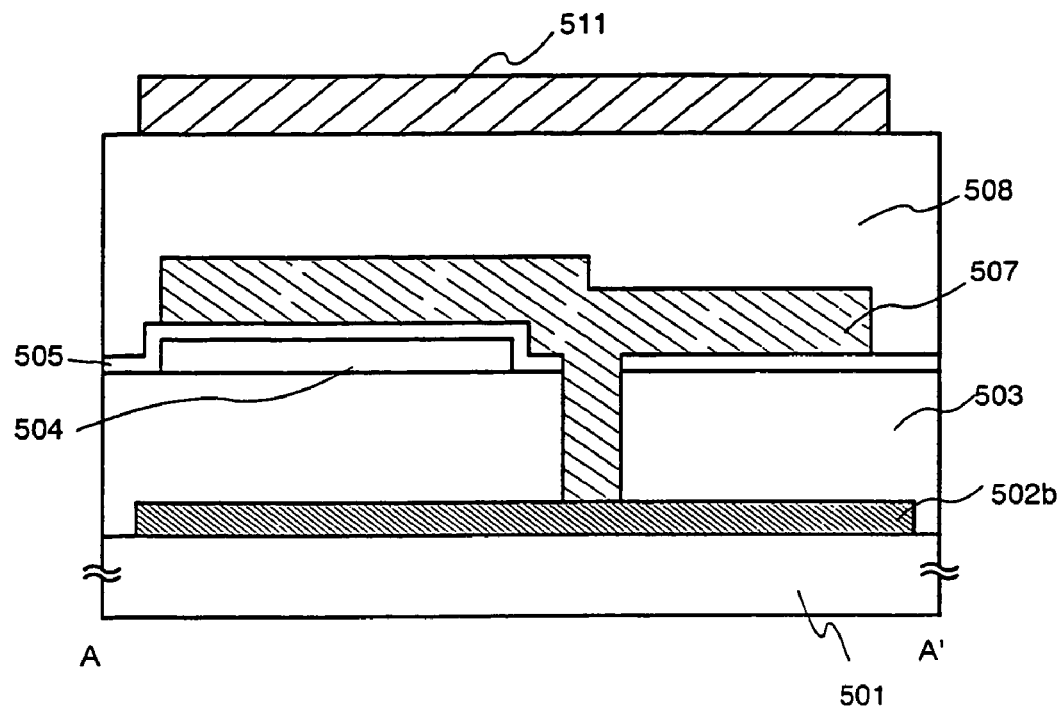
Fig. 15B  B-B' Cross sectional view
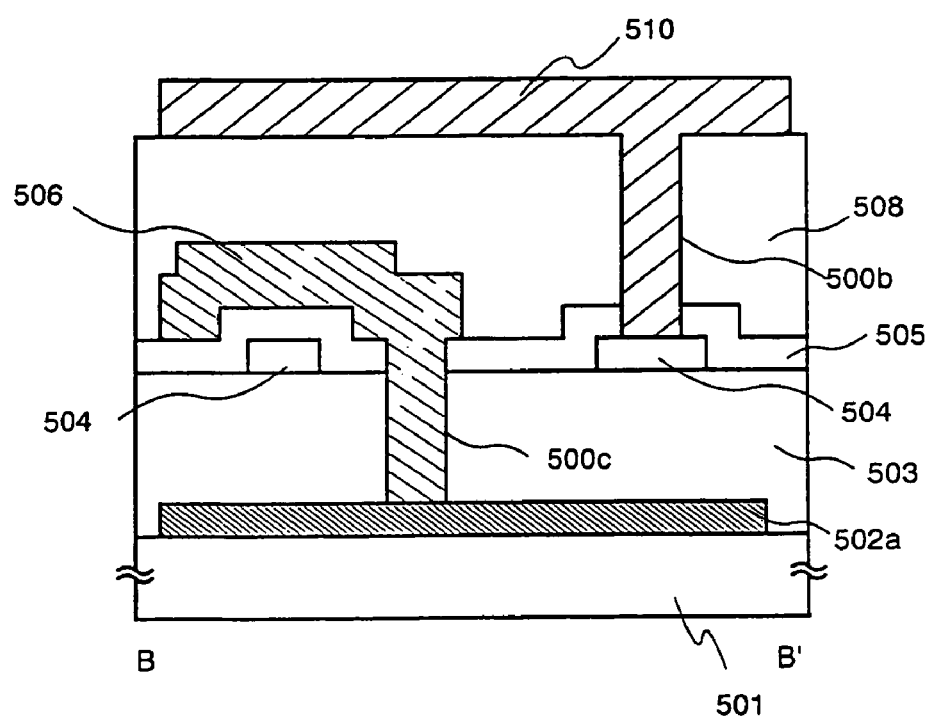

Fig. 18 Prior Art
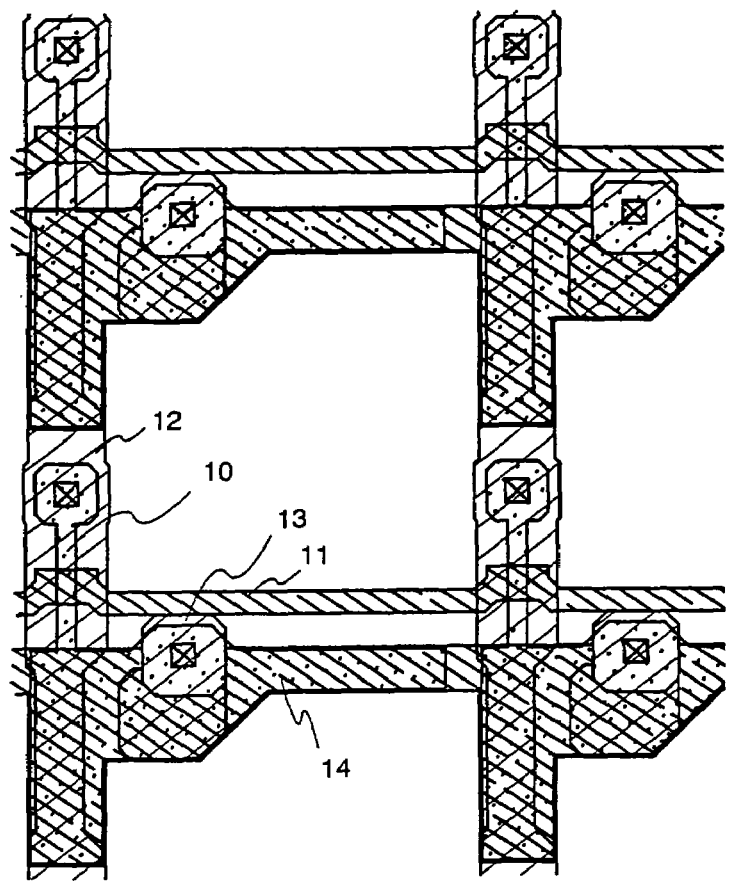
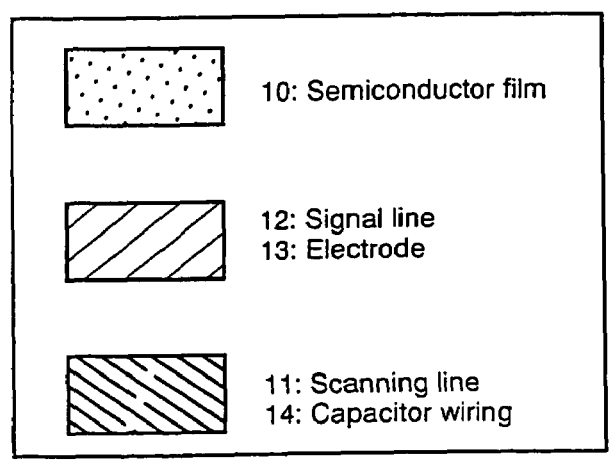

Fig. 19   Prior Art
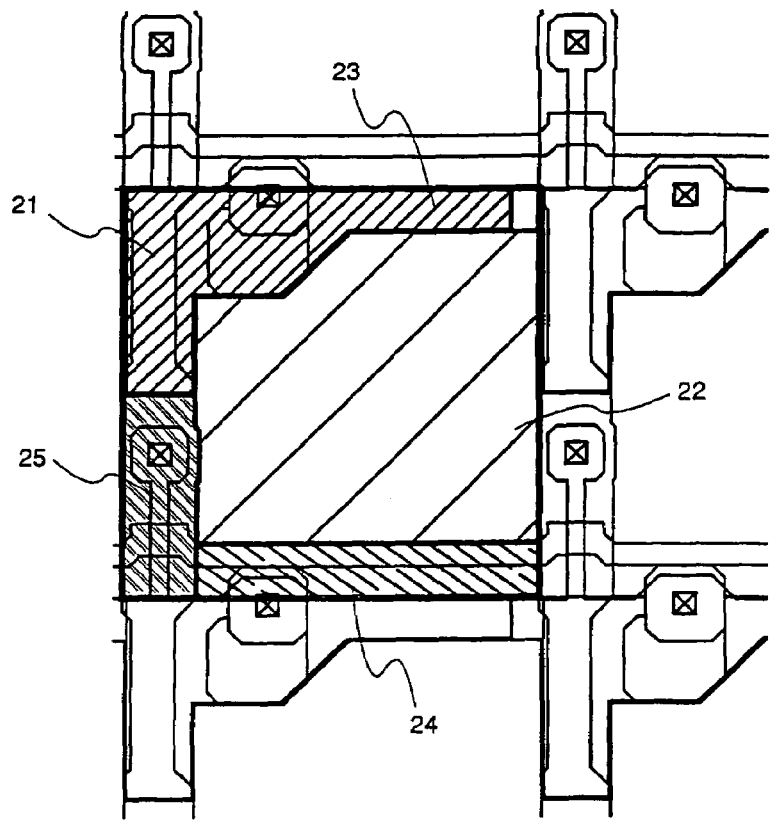
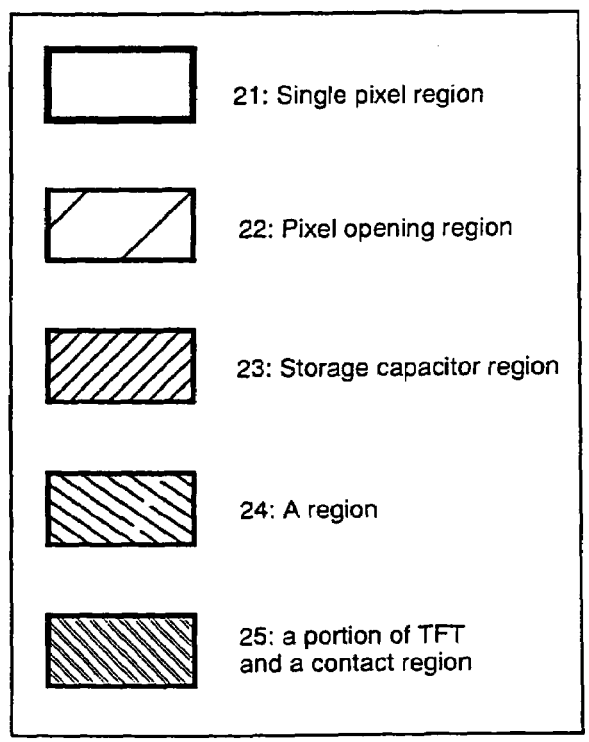
21: Single pixel region
22: Pixel opening region
23: Storage capacitor region
24: A region
25: a portion of TFT and a contact region

DISPLAY DEVICE COMPRISING PIXEL PORTION

This application is a division of application Ser. No. 10/456,503, filed on Jun. 9, 2003, now U.S. Pat. No. 7,098,086, which is a division of application Ser. No. 09/653,535, filed on Aug. 31, 2000, now U.S. Pat. No. 6,583,472.

BACKGROUND OF THE INVENTION

1. Field of the Invention

The present invention relates to a semiconductor device having a circuit constructed of a thin film transistor (hereinafter referred to as TFTs) and a method of manufacturing the same. For example, the present invention relates to an electro-optical device typified by a liquid crystal display panel, and electronic equipment having such an electro-optical device mounted thereon as a part.

It is to be noted that a semiconductor device as used herein throughout the present specification denotes a general device which functions by utilizing semiconductor characteristics, and that electro-optical devices, semiconductor circuits, and electronic equipments are all semiconductor devices.

2. Description of the Related Art

Techniques for structuring a thin film transistor (TFT) using a semiconductor thin film (having a thickness on the order of about several to several hundred nm) formed on a substrate having an insulating surface have been in the spotlight in recent years. Thin film transistors are widely applied to electronic devices such as an IC or an electro-optical device, and in particular, development of the TFT as a switching element of a liquid crystal display device is proceeding rapidly.

In order to obtain high quality images in the liquid crystal display device, an active matrix type liquid crystal display device that utilizes TFTs as switching elements to be connected to respective pixel electrodes which are arranged in matrix is attracting much attention.

It is necessary that the electric potential of an image signal is held in each pixel electrode connected to the TFTs until the next write-in time in order to perform good quality display in the active matrix type liquid crystal display device. Generally, the provision of a storage capacitor (Cs) in each pixel holds the electric potential of the image signal.

Various proposals have been made for the structure and the formation methods of the above stated storage capacitor (Cs). However, from the viewpoint of reliability or simplicity of the manufacturing process, it is preferable that, of the insulating films for structuring a pixel, a gate insulating film of a TFT, which has the highest quality is utilized as a dielectric of the storage capacitor (Cs). Conventionally, as shown in FIG. 18, a capacitor wiring that becomes an upper electrode is first provided by utilizing a scanning line, and then the formation of the storage capacitor (Cs) is carried out by using the upper electrode (capacitor wiring), a dielectric layer (gate insulating film), and a lower electrode (semiconductor film).

Also, from the viewpoint of display performances, there is a demand for giving pixels larger storage capacitors as well as making the aperture ratio higher. Efficient utilization of a back light is improved if each pixel has a high aperture ratio. Consequently, the amount of back light for obtaining a predetermined display luminance can be restrained, and therefore attainment of a power-saving and small scale display device can be achieved. Furthermore, each pixel is provided with a large storage capacitor, thereby improving the characteristic of each pixel in holding display data, to improve the display quality. In addition, in case of point sequential driving of the display device, a signal storage capacitor (sample hold capacitor) is required in the driver circuit side of each signal line. However, with the provision of a large storage capacitor in each pixel, a surface area occupied by the sample hold capacitor can be made smaller, and therefore the display device can be made smaller.

Such demands become problems in proceeding with the progress of making the pitch of each display pixel microscopic which accompanies the progress of making a liquid crystal display device smaller and high definition (increasing the number of pixels).

There is an additional problem in that it is difficult to make a high aperture ratio and a large storage capacitor compatible with each other in the above stated conventional pixel structure.

An example in which a conventional pixel structure having the size of a pixel formed to 19.2 µm in accordance with the design rule of Table 1 is shown in FIG. 18.

TABLE 1

Si layer: minimum size = 0.8 µm, minimum spacing = 1.5 µm
Gate electrode: minimum size = 1.0 µm, minimum spacing = 1.5 µm
Scanning line: minimum size = 1.5 µm, minimum spacing = 1.5 µm
Contact hole of signal line and Si layer: minimum size = 1.0 µm☐
   margin of the contact hole and the Si layer = 1.0 µm
   minimum spacing of the contact hole and the scanning (gate electrode) line = 1.3 µm
Signal line: minimum size = 1.5 µm, minimum spacing = 1.5 µm
   margin of the contact hole and the signal line = 1.3 µm
Pixel size: 19.2 µm☐
Pixel TFT: L = 1.5 µm, W = 0.8 µm, single gate
Scanning line: minimum size of the wiring width = 1.0 µm
Scanning line: minimum size of the wiring width at a portion of overleaping Si layer = 1.5 µm
Capacitor wiring: minimum size = 2.0 µm A characteristic of the conventional pixel structure is that two wirings (a scanning line and a capacitor wiring) are arranged parallel to each other in relation to the continuous formation of the two respective wirings, the scanning line and the capacitor wiring. In FIG. 18, reference numeral 10 denotes a semiconductor film, 11 denotes a scanning line, 12 denotes a signal line, 13 denotes an electrode, and 14 denotes a capacitor wiring. Note that FIG. 18 is a simplified top view of the pixel, and therefore a pixel electrode that is connected to the electrode 13 and a contact hole that reaches the electrode 13 are both not shown in the figure.

Thus, in the case of structuring the storage capacitor with a upper electrode (capacitor wiring), a dielectric layer (gate insulating film), and a lower electrode (semiconductor film), all the circuit elements (a pixel TFT, a storage capacitor, a contact hole, ect.) necessary for structuring a circuit of the pixel become elements relevant to a gate insulating film. Accordingly, these elements constituting the circuit elements are arranged almost planarly within each pixel.

Therefore, it is crucial to efficiently layout the circuit elements that are necessary for constructing the circuit of the pixel in order to attain both a high aperture ratio and a large storage capacitor of each pixel within the regulated pixel size. In other words, from the fact that all the circuit elements are in connection with the gate insulating film, it can be said that it is essential to improve the efficiency of utilizing the gate insulating film.

Thus, from the above perspective, an efficient planar layout of the example of the circuit structure of a pixel of FIG. 18 is shown in FIG. 19. In FIG. 19, reference numeral 21 denotes a single pixel region, 22 denotes a pixel opening region, 23 denotes a storage capacitor region, 24 denotes an A region, and 25 denotes a portion of the TFT and a contact region.

With respect to the area of the pixel opening region 22 which is 216.7 μm² (aperture ratio of 5.8.8%) as shown in FIG. 19, it is composed of the areas of the storage capacitor region 23 which is 64.2 μm², the portion of the TFT and the contact region 25 which is 42.2 μm², and the A region 24 which is 34.1 μm².

The A region 24 is a segregation region of the scanning line and the capacitor wiring which originated from the fact that a wiring portion for mutually connecting a region that functions as a gate electrode of a TFT, the scanning line and the capacitor wiring are arranged parallel to each other. The gate insulating film of the A region is not rendered its original function, becoming a cause of reducing the efficiency of layout.

Further, in the case of the above structure, there is a problem in that the demand for a capacitor wiring resistance has become strict.

In a normal liquid crystal display device drive, the writing-in of the electric potential of the image signal to the plurality of pixels connected to each scanning line is performed consecutively in the scanning line direction (in the case of the point sequential drive) or all at the same time (in the case of the linear sequential drive).

In terms of arranging the capacitor wiring and the scanning line parallel to each other in the pixel structure as stated above, the plurality of pixels connected to the respective scanning lines are connected to a common capacitor wiring. Therefore, opposing electric currents for a plurality of pixels corresponding to the pixel writing-in electric current continuously or simultaneously flow in the common capacitor wiring. In order to avoid a reduction in display quality caused by the electric potential variation of the capacitor wiring, it is necessary to sufficiently lower the capacitor wiring resistance.

However, widening the width of the wiring for lowering the resistance of the capacitor wiring means that the surface area of the storage capacitor is enlarged while the aperture ratio of the pixel is reduced.

SUMMARY OF THE INVENTION

The present invention has been made in view of the above problems as a solution for the designing side, and therefore has an object to provide a liquid crystal display device having high quality display by obtaining a high aperture ratio while securing a sufficient storage capacitor (Cs), and at the same time, by dispersing a load (a pixel writing-in electric current) of the capacitor wiring in a timely manner to effectively reduce the load.

The structure of the invention disclosed in the present specification is a semiconductor device, characterized by comprising:
a first wiring on an insulating surface;
a first insulating film on said first wiring;
a semiconductor film on said first insulating film;
a second insulating film on said semiconductor film;
a second wiring and a gate electrode to be connected to said first wiring on said second insulating film;
a third insulating film on said second wiring and said gate electrode; and
a third wiring to be connected to said semiconductor film on said third insulating film.

In the above-mentioned structure, the semiconductor device is characterized in that the semiconductor film and the second wiring overlap via the second insulating film.

Further, in the above-mentioned respective structures, the semiconductor device is characterized in that a storage capacitor is formed with the second insulating film as a dielectric in a region where the second wiring and the semiconductor film overlap via the second insulating film.

Further, in the above-mentioned respective structures, the semiconductor device is characterized in that an impurity element that imparts a conductivity type is doped into the region of the semiconductor film where the second wiring overlaps via the second insulating film.

Further, in the above-mentioned respective structures, the semiconductor device is characterized by further comprising an electrode to be connected to the semiconductor film and a pixel to be connected to the electrode on the third insulating film.

Further, in the above-mentioned respective structures, the semiconductor device is characterized in that the first wiring and the second wiring are arranged in a direction orthogonal with each other.

Further, in the above-mentioned respective structures, the semiconductor device is characterized in that the first wiring is arranged in a direction orthogonal to the third wiring.

Further, in the above-mentioned respective structures, the semiconductor device is characterized in that the gate electrode is formed on a different layer from the first wiring.

Further, in the above-mentioned respective structures, the semiconductor device is characterized in that the gate electrode is patterned into an island shape.

Further, in the above-mentioned respective structures, the semiconductor device is characterized in that the first wiring comprises a scanning line.

Further, in the above-mentioned respective structures, the semiconductor device is characterized in that the second wiring comprises a capacitor wiring.

Further, in the above-mentioned respective structures, the semiconductor device is characterized in that the third wiring comprises a signal line.

Further, in the above-mentioned respective structures, the semiconductor device is characterized in that the second insulating film comprises a gate insulating film.

Further, in the above-mentioned respective structures, the semiconductor device is characterized in that the gate electrode is made of a film having as its principal constituent an element selected from the group consisting of poly-Si, W, $WSi_x$, Al, Ta, Cr, or Mo which have been doped with an impurity element that imparts a type of conductivity, or a lamination film of a combination of these elements.

Further, the structure of another invention is a semiconductor device, characterized by comprising:
a plurality of signal lines arranged parallel to each other at a predetermined interval and connected to a signal line driver circuit;
a plurality of scanning lines arranged parallel to each other at a predetermined interval and connected to a scanning line driver circuit; and
a capacitor wiring arranged parallel to the signal line.

Further, in the above-mentioned structures, the semiconductor device is characterized in that the scanning lines are orthogonal to the signal lines.

Further, in the above-mentioned respective structures, the semiconductor device is characterized by further comprising a thin film transistor having a gate electrode connected to the scanning line which is orthogonal to the signal line and a pixel electrode connected to the thin film transistor.

Further, in the above-mentioned respective structures, the semiconductor device is characterized in that the gate electrode is formed on a different layer from the scanning line.

Further, in the above-mentioned respective structures, the semiconductor device is characterized in that the gate electrode is patterned into an island shape.

Further, the structure of the invention to attain the above structure is a method of manufacturing a semiconductor device, characterized by comprising:

a first step of forming a first wiring on a substrate having an insulating surface;

a second step of forming a first insulating film on the first wiring;

a third step of forming a semiconductor film on the first wiring;

a fourth step of forming a second insulating film on the semiconductor film;

a fifth step of forming a first contact hole reaching the first wiring by selectively etching the first insulating film and the second insulating film;

a sixth step of forming a gate electrode on the second insulating film overlapping a portion of the semiconductor film and connected to the first wiring through the first contact hole;

a seventh step of forming a third insulating film on the gate electrode;

an eighth step of forming a second contact hole reaching the semiconductor film by selectively etching the second insulating film and the third insulating film; and a ninth step of forming a third wiring on the third insulating film connected to the semiconductor film through the second contact hole.

Further, in the above-mentioned structure, the manufacturing method is characterized in that a second wiring is formed on the second insulating film to overlap a portion of the semiconductor film in the same step as forming the gate electrode.

Further, in the above-mentioned structure, the manufacturing method is characterized by further comprising a step of partially thinning the second insulating film that overlaps the second wiring after the step of forming the second insulating film on the semiconductor film.

Further, in the above-mentioned structure, the manufacturing method is characterized in that the second insulating film is a gate insulating film, the first wiring is a scanning line, the second wiring is a capacitor wiring, and the third wiring is a signal line.

BRIEF DESCRIPTION OF THE DRAWINGS

In the accompanying drawings:

FIGS. 3A and 3B are diagrams showing cross-sectional views of the TFT substrate;

FIGS. 6A to 6F are diagrams showing examples of electronic equipment;

FIGS. 8A to 8C(1) and FIG. 8C(2) are cross-sectional views and a top view, respectively, showing a process of manufacturing a pixel portion;

FIGS. 9A to 9C(1) and FIG. 9C(2) are cross-sectional views and a top view, respectively, showing a process of manufacturing a pixel portion;

FIGS. 10A to 10C(1) and FIG. 10C(2) are cross-sectional views and a top view, respectively, showing a process of manufacturing a pixel portion;

FIGS. 11A and 11B(1) and FIG. 11B(2) are cross-sectional views and a top view, respectively, showing a process of manufacturing a pixel portion;

FIGS. 12A (1) and 12B (2) are a cross-sectional view and a top view, respectively, showing a process of manufacturing a pixel portion;

FIGS. 15A and 15B are diagrams showing cross-sectional views of a pixel structure;

FIG. 18 is a top view of a conventional pixel; and

FIG. 19 is a view showing a conventional pixel opening region.

DETAILED DESCRIPTION OF THE PREFERRED EMBODIMENTS

Hereinafter, preferred embodiments of the present invention will be described.

The present invention is characterized in that a scanning line is formed on a different layer from a gate electrode in order to increase an aperture ratio as well as to increase a storage capacitor. An example of a pixel structure of the present invention is shown in FIG. 1.

Figure 1:
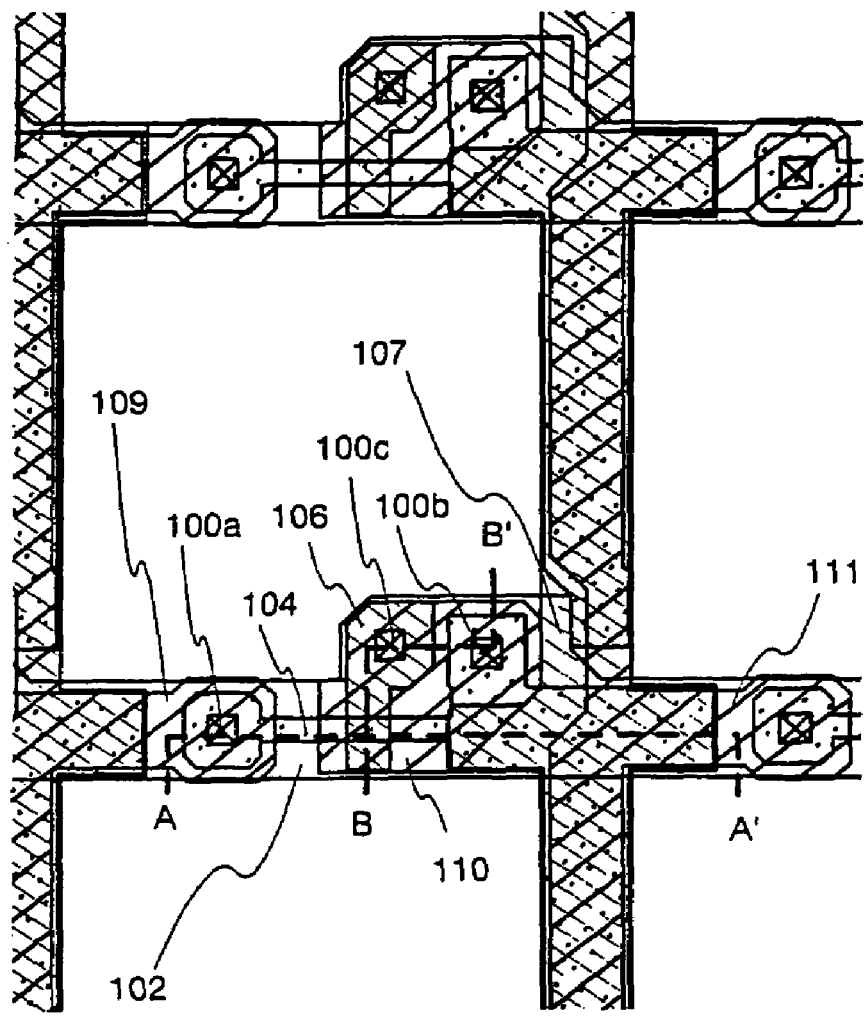
FIG. 1 is a top view of a pixel.

In FIG. 1, a gate electrode 106 formed into an island shape by patterning is connected to a scanning line 102 through a contact hole 100c formed at an insulating film. Further, a semiconductor film 104 is connected to a signal line 109 through a contact hole 100a. In addition, the semiconductor film 104 is connected to an electrode 110 through a contact hole 100b. A region of the semiconductor film that is connected to the signal line 109 or the electrode 110 is referred to as a source region or a drain region. Further, a channel forming region is formed between the source region and the drain region, and the gate electrode 106 is present on the channel forming region through a gate insulating film. Note that the source region, the drain region, and the channel forming region are not shown in the figure for simplification.

According to the present invention, in the case of forming the scanning lines 102 on the lower layer of the gate electrode 106 as shown in FIG. 1, the scanning lines 102 will be provided on the lower layer of the semiconductor film 104, thus making it possible to function as a light shielding film. In addition, the storage capacitor is formed with the lower electrode as the semiconductor film, the insulating film covering the semiconductor film as a dielectric, and the upper electrode as a capacitor wiring 107. It is to be noted that the storage capacitor may be enlarged by partially thinning the insulating film which covers the semiconductor film.

Further, according to an aspect of the present invention, TFTs of each pixel can be a dual gate structure in which a gate electrode is provided on the upper and lower part of the channel forming region through an insulating film, and the storage capacitor formed of the scanning line and another wiring can be restrained while improving the characteristics of the TFTs by setting the film thickness of a first insulating film appropriately.

The present invention, unlike the prior art (the capacitor wiring is arranged parallel with the scanning line), is characterized in that the capacitor wiring is arranged so that it is parallel with the signal line. Accordingly, good display image can be obtained since variations in the electric potential of the capacitor wiring due to a writing-in current of a neighboring pixel are avoided because each pixel is connected to storage capacitors formed of respective independent capacitor wirings even if consecutive writing-in of the image signals is performed to the pixels corresponding to each scanning line under the driving method.

Conventionally, a sample hold capacitor is provided in each signal line in order to prevent the signal line electric potential (a writing electric potential) from being reduced during a writing period to each scanning line. In the present invention, the capacitor wiring is arranged parallel with and overlapping the signal line. Therefore, it is not necessary to provide the sample hold capacitor in a portion of the peripheral circuit from the fact that the parasitic capacitance of the signal line increases, thereby improving the holding characteristics of the signal line electric potential. In comparison with the prior art, the peripheral circuits can be made smaller.

In addition, the demand performance for the capacitor wiring resistance has been alleviated because of the same reasons as the above, and therefore there is more degree of freedom in designing the arrangement, size, and film thickness of the capacitance wiring. Furthermore, because the selection range of the materials for the capacitor wiring has widened, the degree of complication in designing and manufacturing has lessened, leading to the attainment of a higher production yield.

Regarding the present invention composed of the above aspect, a detailed description will be made of the embodiments shown in the following.

Embodiment 1

Hereinafter, embodiments of the present invention will be described taking a point sequential drive of a projector type liquid crystal display device as an example.

An active matrix type liquid crystal display device utilizing a TFT as its switching element is constructed of a substrate (TFT substrate) with pixel electrodes arranged in matrix and an opposing substrate with opposing electrodes formed thereon arranged facing the TFT substrate via a liquid crystal layer. The space between the two substrates are controlled at a predetermined interval via spacers, etc. and a sealing material is used around the outer periphery portion of the display region to enclose the liquid crystal layer.

Figure 4:
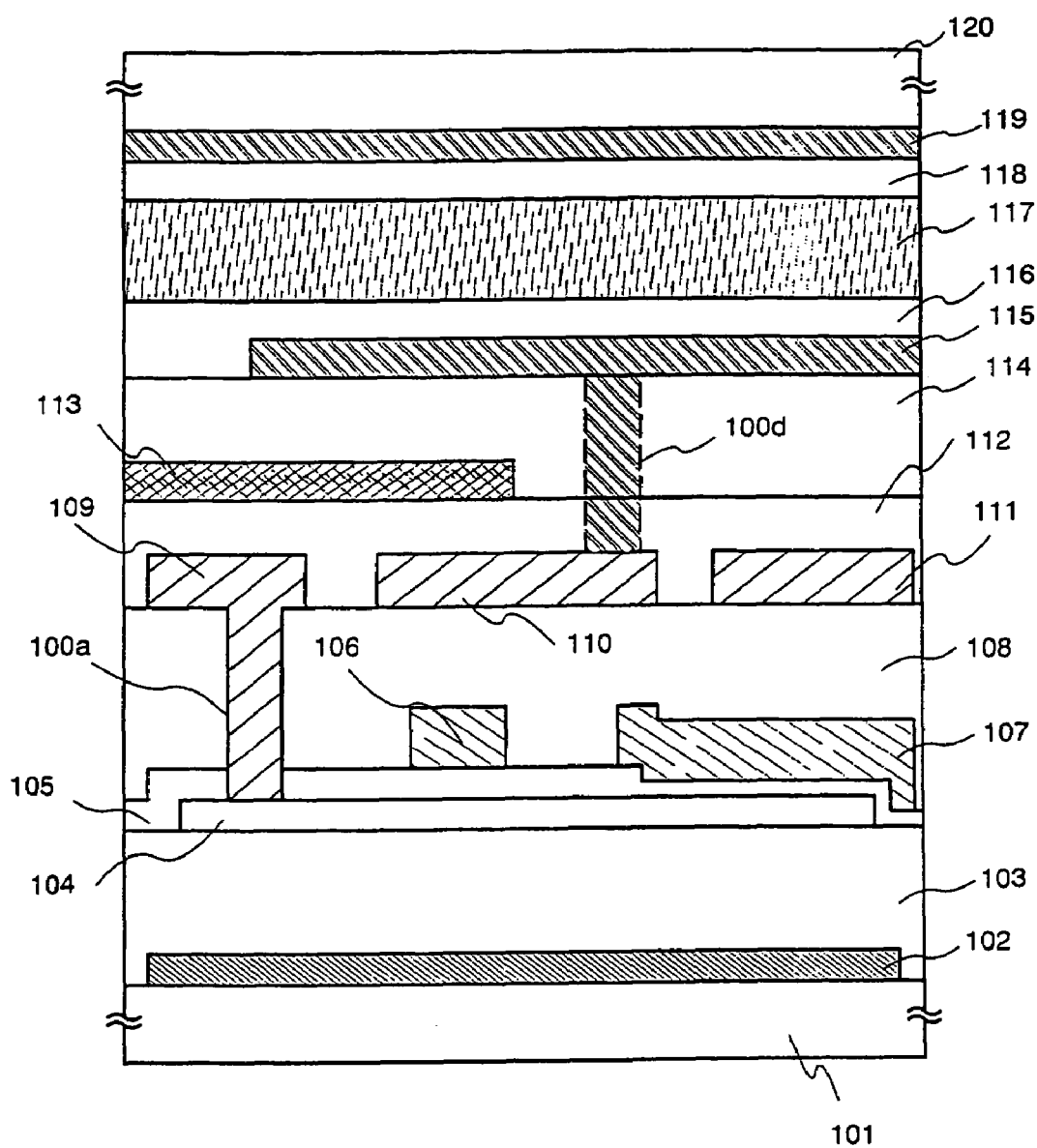
FIG. 4 is a diagram illustrating the cross-sectional structure of an active matrix type liquid crystal display device.

FIG. 4 is a view schematically showing a cross-sectional structure of the liquid crystal display device of the present embodiment. In FIG. 4, reference numeral 101 denotes a substrate (TFT substrate), 102 denotes the scanning lines, 103 denotes a first insulating film, 104 denotes the semiconductor film, 105 denotes a gate insulating film (a second insulating film), 106 denotes the gate electrode, 107 denotes a capacitor wiring, 108 denotes a third insulating film, and 109 and 111 denote signal lines or electrodes diverged from the signal lines. Reference numeral 110 denotes an electrode which is connected to the semiconductor film through a contact hole (not shown in the figure) which is formed with the third insulating film. Further, the gate electrode 110 is an electrode for connecting the TFTs to the pixel electrodes.

It is to be noted that throughout the present specification, the term "electrode" implies a part of the "wiring" and indicates a place at which the wiring is electrically connected with another wiring, or a place at which the wiring intersects a semiconductor layer. Thus, for the sake of explanation conveniences, the terms "wiring" and "electrode" are used distinguishably. However, the term "electrode" shall always include the meaning of "wiring".

Note that portions denoted by the reference numerals 101 to 110 are defined as TFTs throughout the present specification. In addition, reference numerals 109 and 110 may be an electrode diverged from a wiring or a wiring.

Furthermore, reference numeral 112 denotes a fourth insulating film which covers the TFTs, 113 denotes a light shielding film for preventing the TFTs from light deterioration, 114 denotes a fifth insulating film, 115 denotes a pixel electrode connected to the electrode 110 through a contact hole 100d, and 116 denotes an alignment film for orientating a liquid crystal layer 117.

Also in FIG. 4, an opposing electrode 119 and an alignment film 118 are provided on an opposing substrate 120, and besides, a light shielding film and a color filter may be provided when necessary.

Figure 2:
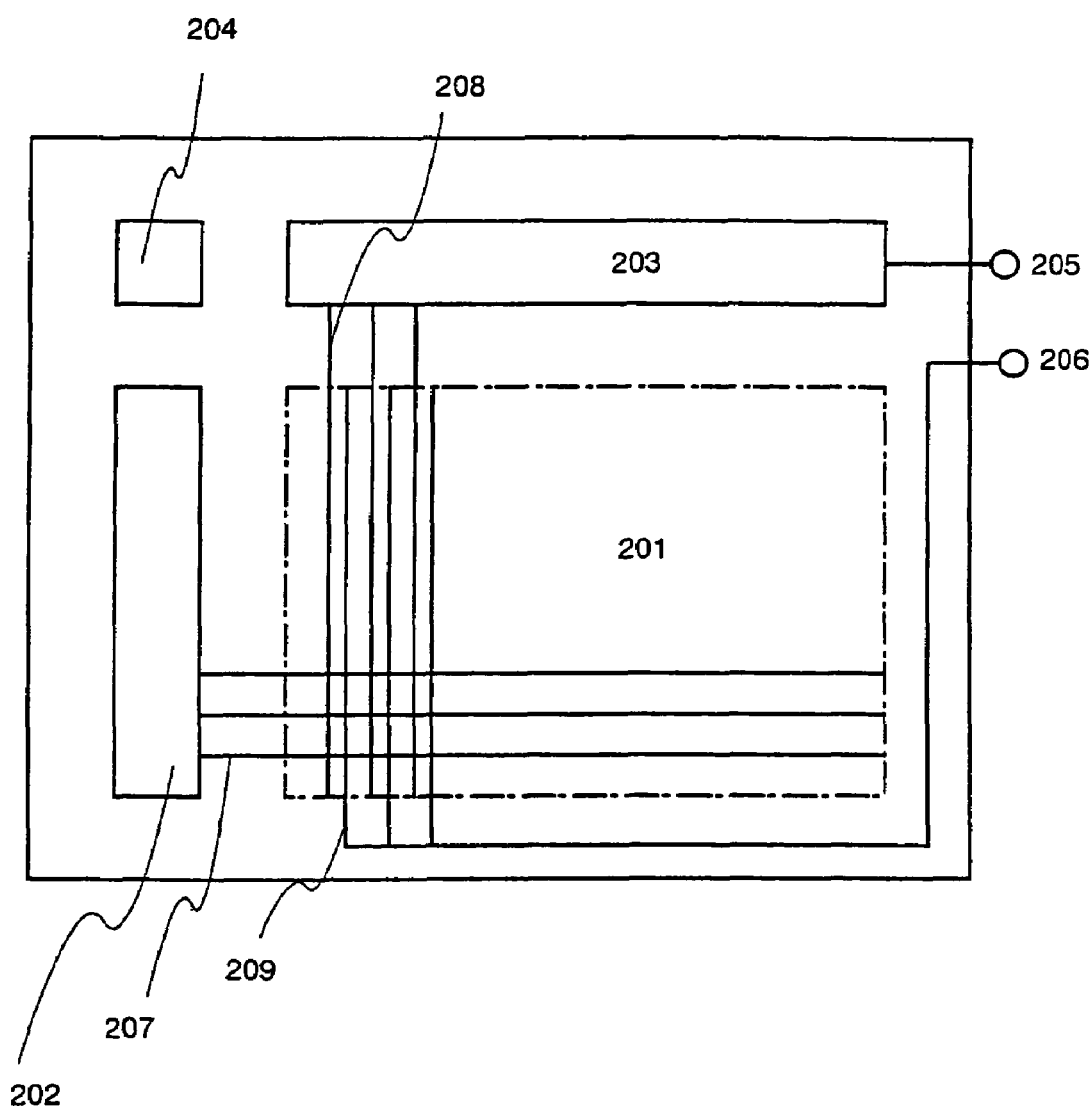
FIG. 2 is a diagram showing a circuit structure of a TFT substrate.

The substrate (TFT substrate) 101 comprises a pixel portion 201, and a scanning line driver circuit 202 and a signal line driver circuit 203 formed in the periphery thereof as shown in FIG. 2.

The scanning line driver circuit 202 is mainly composed of shift registers for sequentially transmitting scanning signals. The signal line driver circuit 203 is mainly composed of sample hold circuits for holding an image signal and driving a signal line after sampling a shift register and the image signal that is inputted on the basis of an output of the shift register.

In the pixel portion 201, a plurality of scanning lines (gate wirings) 207 connected to the scanning line driver circuit 202 and arranged parallel to each other at a predetermined interval and a plurality of signal lines 208 connected to the signal line driver circuit 203 with a terminal for inputting an image signal 205 and arranged parallel to each other at a predetermined interval. The scanning lines 207 are orthogonal to the signal lines 208. Together with arranging TFTs (not shown in the figure) at each point of intersection, pixel electrodes (not shown in the figure) are arranged in the respective regions marked off by the scanning lines and signal lines. Thus, each pixel electrode is arranged in matrix from this structure. In addition, a plurality of capacitor wirings 209 connected to a GND (ground) or a fixed electric potential 206 are provided parallel to the signal lines 208. Reference numeral 204 denotes a driver circuit disposed on an opposing substrate. It is to be noted that for simplification, only a few lines of the signal lines, the scanning lines, and the capacitor wirings are shown in FIG. 2.

Hereinafter, a simplified process of manufacturing a semiconductor device shown in FIG. 4 is described with references to FIGS. 1, 3A, and 3B.

First, besides a glass substrate as the substrate 101, a quartz substrate and a plastic substrate can also be used. In the case of using a glass substrate, heat treatment may be performed in advance at a temperature that is approximately 10 to 20° C. lower than the distortion point of glass. Furthermore, a base film is formed on the surface of the substrate 101 on which the TFTs will be formed in order to prevent the diffusion of impurities from the substrate 101. The base film is made of an insulating film such as a silicon oxide film, a silicon nitride film, or a silicon oxynitride film.

Next, a conductive film is formed on the substrate and then patterning is performed to thereby form the scanning lines 102. Conductive materials such as poly-Si, $WSi_x$ (X=2.0 to 2.8), Al, Ta, W, and Cr which have been doped with an impurity element that imparts a type of conductivity and a laminated structure thereof can be used for the scanning lines 102. In this embodiment, the scanning lines 102, arranged at a predetermined interval, are formed of a laminated structure composed of a WSi$_x$ film (film thickness: 100 nm) and a poly-Si film (film thickness: 50 nm), which are conductive materials having high light blocking characteristics.

Covering the scanning lines 102 and having a film thickness of about 500 nm, the first insulating film 103 is formed next. An insulating film containing silicon formed by known methods such as plasma CVD or sputtering is used for the first insulating film 103. In addition, the first insulating film 103 may be formed of a film made of an organic insulating material, a silicon oxide film, a silicon oxynitride film, or a silicon nitride film, or a lamination film of a combination of these films.

The semiconductor film is formed next to a thickness of between 25 and 80 nm (preferably between 30 and 60 nm) by known methods such as plasma CVD or sputtering, and then patterned into a desired shape. In this embodiment, an amorphous silicon film is formed to about 50 nm thick by plasma CVD. With a known crystallization method, a crystallization process is performed to form a crystalline silicon film (poly-Si) from the amorphous silicon film. Then patterning is conducted on the crystalline silicon film to pattern it into an island shape. Although the present embodiment uses a crystalline silicon film (poly-Si), no particular limitations are placed as long as it is a semiconductor film. Note that throughout the present specification, the term "semiconductor film" denotes a single crystal semiconductor film, a crystalline semiconductor film (such as poly-Si), an amorphous semiconductor film (such as a-Si), or a microcrystalline semiconductor film. Further, a compound semiconductor film such as a silicon germanium film is also included as the "semiconductor film".

An insulating film containing silicon formed by methods such as plasma CVD or sputtering, or an oxide film formed of a semiconductor film (such as an Si film) which has been thermally oxidized is used to form the second insulating film (gate insulating film) 105. The second insulating film 105 may be a laminate structure made up of a plurality of layers such as two layers or three layers when necessary.

Thereafter, in order to construct a TFT that functions as an image signal writing-in switch, with utilization of the respective island shape semiconductor films, a known technique is employed to selectively dope an impurity element (such as phosphorus or boron) that imparts a p-type or an n-type conductivity into the island shape semiconductor film, thereby forming a low resistance source region and drain region, and further forming a low resistance region. This low resistance region is similar to the drain region in that it is doped with an impurity element (typically phosphorus or boron) and is a part of the semiconductor films that have been made low resistance. Note that the order of the process of selectively doping the impurity element is not particularly limited. For example, the impurity element may be doped before the formation of the first insulating film and the gate electrode, or after the formation of the gate electrode. In addition, an LDD region and an offset region may be formed in response to the circuit structure. It is to be noted that the respective regions are not shown in the figure for simplification.

Thus, a channel forming region is formed between the source region and the drain region in the semiconductor film 104.

Next, selective etching is performed on the the first insulating film 103 and the second insulating film 105 to thereby form the first contact hole 100c shown in FIG. 3B reaching the scanning lines 102.

A conductive film is formed next on the second insulating film 105. Then patterning is performed to form the gate electrode 106 and the capacitor wiring 107. The gate electrode 106 and the capacitor wiring 107 are formed at the thickness of about 300 nm with conductive materials such as poly-Si, WSi$_x$ (X=2.0 to 2.8), Al, Ta, W, Cr, and Mo which 0.25 have been doped with an impurity element that imparts a type of conductivity, and a laminated structure thereof. Further, a single layer may be formed for the gate electrode 106 and the capacitor wiring 107, but a laminate structure made up of a plurality of layers such as two layers or three layers may also be formed when necessary. In this case, each gate electrode formed into an island shape is electrically connected to the scanning lines 102 via the first contact hole 100c which is formed with the first insulating film 103 and the second insulating film 105.

The island shape gate electrode 106 is arranged on the channel forming region of each pixel through the second insulating film 105. Further, the capacitor wirings 107 are arranged on the low resistance region through the second insulating film 105. Note that the storage capacitor may be enlarged by adding a process in which the film of a region where the capacitor wirings 107 overlap the second insulating film 105 is partially thinned. The capacitor wirings 107 are also arranged continuously to each pixel in the signal line direction and electrically connected outside the display region to the ground or to the fixed electric potential.

The third insulating film 108 is formed next covering the gate electrode 106 and the capacitor wirings 107. An insulating film containing silicon formed by methods such as plasma CVD or sputtering is used for the third insulating film 108. In addition, the third insulating film 108 may be formed of a silicon oxide film, a silicon oxynitride film, a silicon nitride film, or a lamination film of a combination of these films.

Next, selective etching is performed on the the second insulating film 105 and the third insulating film 108 to thereby form the second contact holes 100a and 100b shown in FIGS. 3A and 3B, respectively, to reach the semiconductor film (the source region or the drain region).

A film having Al, W, Ti, and TiN as its main component or a conductive film (film thickness: 500 μm) having a laminated structure of these elements is next formed on the third insulating film 108. Then patterning is performed, thereby forming the signal lines 109 and 111 and the island shape electrode 110 for connection with a pixel electrode which will be formed later. The signal lines 109 and 111 are connected to either the source region or the drain region through the second contact holes 100a and 100b that reach the semiconductor film. Similarly, the island shape electrode 110 is connected to either the source region or the drain region through the second contact hole 100a that reaches the semiconductor film. Furthermore, the signal lines 109 and 111 are arranged in a direction parallel to the capacitor wirings 107.

The island shape electrode 110 is arranged so as to be isolated from the signal line 109. However, both the signal line 109 and the island shape electrode 110 will not be connected to the source region together. Similarly, both the signal line 109 and the island shape electrode 110 will not be connected to the drain region together.

A top view of the pixel at this stage corresponds to FIG. 1, and the schematic views of the cross-sectional structure in which the cross sections are taken along the broken line A-A' and the broken line B-B' in FIG. 1 correspond to FIGS. 3A and 3B respectively.

The fourth insulating film 112 is formed next covering the signal line 109 and the island shape electrode 110. The fourth insulating film 112 may be formed of a film such as an organic insulating material film, a silicon oxide film, a silicon oxynitride film or a silicon nitride film, or a lamination film of a combination of these films.

Subsequently, a film having high light shielding characteristics formed of materials such as Ti, Al, W, Cr, or black-colored resin is formed on the fourth insulating film 112 and then patterned into a desired shape, thereby forming the light shielding film 113. The light shielding film 113 is arranged mesh like so that other areas, except the opening portion of the pixel, are shielded from light.

In Embodiment 1, although the light shielding film 113 becomes electrically floating, if a low resistance film is selected as the material for the light shielding film, then it is possible to control the light shielding film to an optional electric potential outside the display portion.

A fifth insulating film 114 is formed next on the light shielding film 113. It is appropriate to form the fifth insulating film 114 with a film made of an organic insulating material. By forming the fifth insulating film 114 with an organic insulating material, the surface can be sufficiently flattened. In addition, parasitic capacitance can be reduced since organic resin materials are generally low in dielectric constant. However, because organic resin materials are absorbent, they are not suitable as protection films. Thus, the fifth insulating film 114 may be a laminate structure with combinations of a silicon oxide film, a silicon oxynitride film, and a silicon nitride film.

Next, selective etching is performed on the the fourth insulating film 112 and the fifth insulating film 114 to thereby form the third contact hole 100d to reach island shape electrode. The third contact hole 100d is indicated by the broken line in FIG. 4 for the sake of convenience.

A transparent conductive film such as an ITO film is formed next and then patterned to thereby form the pixel electrode 115. The pixel electrode 115 is connected to the island shape electrode 110 through the third contact hole 100d. The respective pixel electrodes are each independently arranged so as to cover the opening portion of each pixel.

The alignment film 116 for orientating the liquid crystal layer 117 is formed on the TFT substrate thus formed. Then the TFT substrate and the opposing substrate 120, which is provided with the opposing electrode 119 and the alignment film 118, are joined together by using a known cell construction technique. Thereafter, a liquid crystal material is injected between both substrates and enclosed therein. The liquid crystal cell in which the liquid crystal layer is held between the two substrates, is thus completed.

By employing the above described manufacturing steps, and furthermore arranging the wirings, the semiconductor film, etc. in accordance with the design rules of Table 2, a surface area of 236.9 $\mu m^2$ of the pixel opening region (aperture ratio: 64.3%) and a surface area of 62.8 $\mu m^2$ of the storage capacitor region can be obtained.

TABLE 2

Si layer: minimum size = 0.8 μm, minimum spacing = 1.5 μm
Gate electrode: minimum size = 1.0 μm, minimum spacing = 1.5 μm
A contact hole of the scanning line and the gate electrode: minimum size = 1.0 μm
    margin of the contact hole and the gate electrode = 1.0 μm
Scanning line: minimum size = 1.5 μm, minimum spacing = 1.5 μm
Contact hole of signal line and Si layer: minimum size = 1.0 μm☐
    margin of the contact hole and the Si layer = 1.0 μm
    minimum spacing of the contact hole and the scanning (gate electrode) line = 1.3 μm
Signal line: minimum size = 1.5 μm, minimum spacing = 1.5 μm
    margin of the contact hole and the signal line = 1.3 μm
Pixel size: 19.2 μm☐
Pixel TFT: L = 1.5 μm, W = 0.8 μm, single gate
Scanning line: minimum size of the wiring width = 1.0 μm
Scanning line: minimum size of the wiring width at a portion of overleaping Si layer = 1.5 μm
Capacitor wiring: minimum size = 2.0 μm In Embodiment 1, the provision of a region for the contact hole 100c for connecting the gate electrode 106 and the scanning line 102 is required in the restructured pixel region. Further, in Embodiment 1, an upper light shielding film is only the film for shielding the peripheral portion of the channel forming region of the island shape Si film from light. Accordingly, it is desired that the structure be provided with an upper light shielding film.

According to the present structure, because the scanning lines 102 function as a lower light shielding film to the channel forming region and the peripheral portion thereof, light incident from the liquid crystal layer 117 is reflected at the lower interface of the TFT substrate and then become incident on the channel forming region and the peripheral portion thereof. Accordingly, the occurrence of light leaking from the TFT can be prevented, making it possible to obtain better display quality.

Embodiment 2

A structure of the active matrix type liquid crystal display device shown in Embodiment 1 will be described here in Embodiment 2 with reference to the perspective view of FIG. 5. It is to be noted that the same reference numerals designate components corresponding to those in Embodiment 1.

Figure 5:
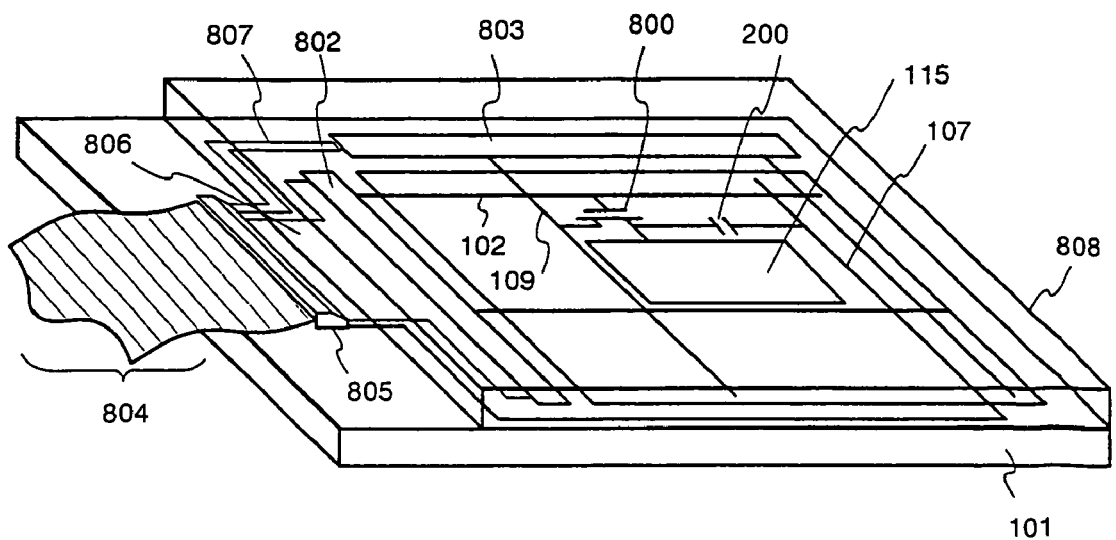
FIG. 5 is a view showing the outer appearance of an AM-LCD.

In FIG. 5, a matrix substrate is composed of a pixel portion, a scanning line driver circuit 802, a signal line driver circuit 803, and other signal processing circuits formed on a substrate 101. A pixel TFT 800 and a storage capacitor 200 are provided in the pixel portion, and the driver circuits provided in the periphery thereof are structured based on a CMOS circuit.

Further, the capacitor wiring 107 is provided in a direction parallel with the signal line 109 and functions as the upper electrode of the storage capacitor 200. The capacitor wiring 107 is also connected to the ground or to a fixed electric potential.

The scanning line 102 and the signal line 109, from the scanning line driver circuit 802 and the signal line driver circuit 803, respectively, extend to the pixel portion and are connected to the pixel TFT 800. Further, an FPC (Flexible Printed Circuit) 804 is connected to an external input terminal 805 to be utilized for inputting signals such as image signals. The FPC 804 is firmly fixed with a reinforced resin. Then connecting wirings 806 and 807 are connected to the respective driver circuits. Though not shown in the figure, a light shielding film and a transparent electrode are provided on an opposing substrate 808.

Embodiment 3

The pixel matrix circuit formed by implementing the present invention can be used in various electro-optical devices (active matrix type liquid crystal display device, active matrix EL display, and active matrix EC display). That is, the present invention can be implemented in all electronic equipment that incorporate these electro-optical devices as a display portion.

The following can be given as such electronic equipment: a video camera, a digital camera, a projector (a rear type or a front type), a head mount display (goggle type display), a car navigation system, a personal computer, a portable information terminal (such as a mobile computer, a cellular phone, and an electronic book) etc. Some examples of these are shown in FIGS. 6A to 6F and FIGS. 7A to 7D.

FIG. 6A shows a personal computer that is comprised of a main body 2001, an image input portion 2002, a display portion 2003, and a keyboard 2004. The present invention can be applied to the display portion 2003.

FIG. 6B shows a video camera that is comprised of a main body 2101, a display portion 2102, an audio input portion 2103, operation switches 2104, a battery 2105, and an image receiving portion 2106. The present invention can be applied to the display portion 2102.

FIG. 6C shows a mobile computer that is composed of a main body 2201, a camera portion 2202, an image receiving portion 2203, operation switches 2204, and a display portion 2205. The present invention can be applied to the display portion 2205.

FIG. 6D shows a goggle type display that is comprised of a main body 2301, display portions 2302, and arm portions 2303. The present invention can be applied to the display portion 2302.

FIG. 6E shows a player which uses a recording medium in which a program is stored (hereinafter referred to as a recording medium) and which is comprised of a main body 2401, a display portion 2402, speaker portions 2403, a recording medium 2404, and operation switches 2405. A DVD (Digital Versatile Disc), a compact disc (CD) or the like is used as the recording medium to enable the player to appreciate music and the movies, and play a video game or the Internet. The present invention can be applied to the display portion 2402.

FIG. 6F shows a digital camera that is comprised of a main body 2501, a display portion 2502, an eye-piece portion 2503, operation switches 2504, and an image receiving portion (not shown in the figure). The present invention can be applied to the display portion 2502.

Figure 7A:
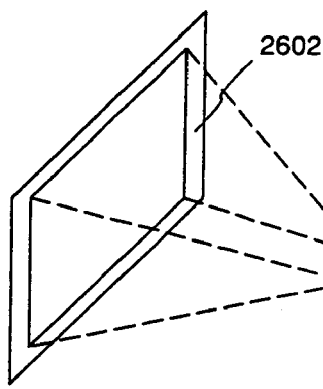
FIGS. 7A to 7D are diagrams showing examples of electronic equipment.

FIG. 7A shows a front type projector that is comprised of a projection unit 2601, a screen 2602, and the like. The present invention can be applied to a liquid crystal display device 2808 which is a part structuring the projection unit 2601.

Figure 7B:
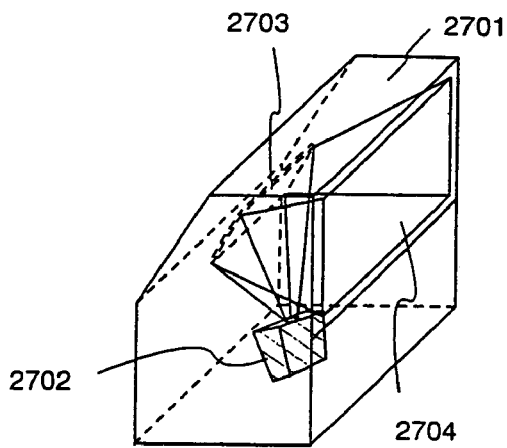

FIG. 7B shows a rear type projector that is comprised of a main body 2701, a projection unit 2702, a mirror 2703, a screen 2704, and the like. The present invention can be applied to the liquid crystal display device 2808 which is a part structuring the projection unit 2702.

Figure 7C:
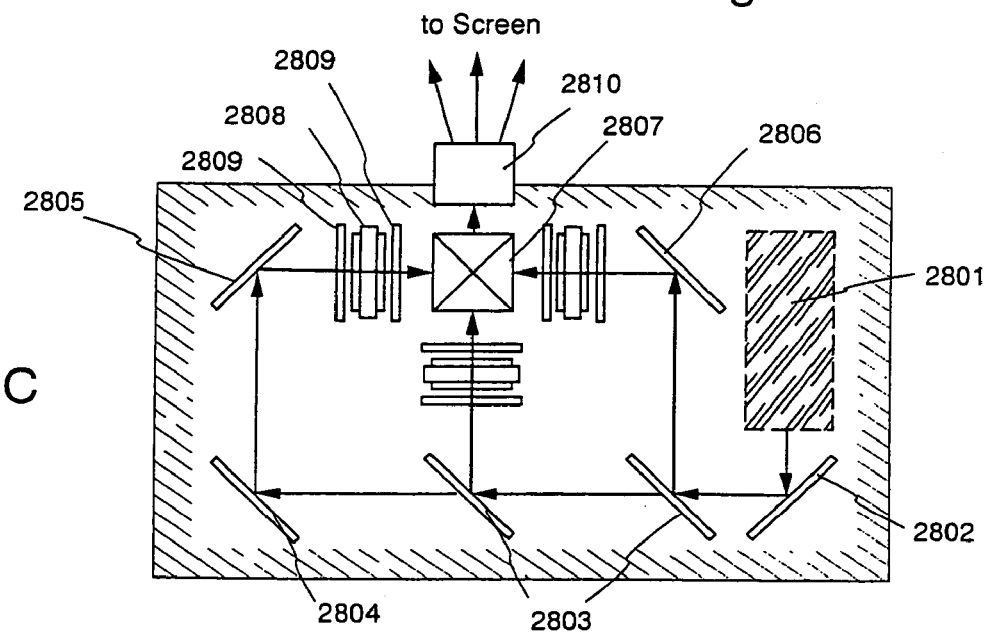

Illustrated in FIG. 7C is an example of the structure of the projection units 2601 and 2702 that are shown in FIGS. 7A and 7B, respectively. Each of the projection units 2601 and 2702 is comprised of a light source optical system 2801, mirrors 2802 and 2804 to 2806, dichroic mirrors 2803, a prism 2807, liquid crystal display devices 2808, phase difference plates 2809, and a projection optical system 2810. The projection optical system 2810 is constructed of an optical system including projection lenses. An example of a three plate system is shown in Embodiment 3, but there are no special limitations. For instance, an optical system of single plate system is acceptable. Further, the operator may suitably set optical systems such as optical lenses, polarizing film, film to regulate the phase difference, IR film, within the optical path shown by the arrows in FIG. 7C.

Figure 7D:
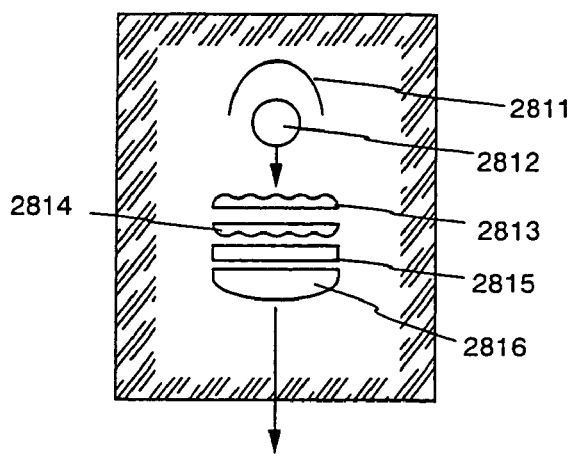

In addition, FIG. 7D shows an example of the structure of the light source optical system 2801 of FIG. 7C. In this embodiment, the light source optical system 2801 is composed of a reflector 2811, a light source 2812, lens arrays 2813 and 2814, a polarizing conversion element 2815, and a condenser lens 2816. Note that the light source optical system shown in FIG. 7D is an example, and it is not limited to the illustrated structure. For example, the operator may suitably set optical systems such as optical lenses, polarizing film, film to regulate the phase difference, and IR film.

Thus, the application range for the present invention is extremely wide, and it may be applied to electronic equipment in all fields. Further, the electronic equipment of this Embodiment can be realized with a composition that uses any combination of Embodiments 1 and 2.

Embodiment 4

An example of a single gate TFT was shown in Embodiment 1, but an example of a double gate TFT will be shown here in Embodiment 4. Nonetheless, their structures are basically the same.

Figure 8A:
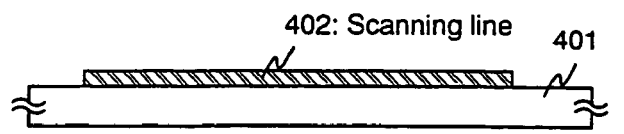

First, a conductive film is formed on a substrate 401 having an insulating surface, and then patterning is carried out to thereby form a scanning line 402. (see FIG. 8A) The scanning line 402 also functions as a light shielding layer to protect an active layer, which will be formed later, from light. A quartz substrate is used as the substrate 401, and a laminate structure of a poly-silicon film (having a film thickness of 50 nm) and a tungsten silicide (W—Si) film (having a film thickness of 100 nm) is used for the scanning line 402. In addition, the poly-silicon film protects the substrate from contamination from the tungsten silicide film.

Figure 8B:

Next, insulating films 403a and 403b are formed to a film thickness of between 100 and 1000 nm (typically between 300 and 500 nm) covering the scanning line 402. (see FIG. 8B) Here, a 100 nm thick silicon oxide film formed by employing the CVD method and a 280 nm thick silicon oxide film formed by employing the LPCVD method are laminated.

An amorphous semiconductor film is then formed with a thickness of 10 to 100 nm. A 69 nm thick amorphous silicon film is formed here by using the LPCVD method. Next, as a technique to crystallize the amorphous semiconductor film, the crystallization technique disclosed in Japanese Patent Application Laid-open No. Hei 8-78329 is employed to perform crystallization of the amorphous semiconductor film. The technique disclosed in the above publication is a crystallization technique in which a metal element for promoting crystallization is selectively doped into the amorphous silicon film, and then heat treatment is carried out. By carrying out the heat treatment, a crystalline silicon film in which its formation starts from the doped region is formed. Nickel is used here as the metal element for promoting crystallization. Heat treatment for crystallization (600° C., 12 hours) was performed after the performing of a heat treatment for releasing hydrogen (450° C., 1 hour).

Thereafter, Ni is gettered from a region as the active layer of the TFT. The region as the active layer of the TFT is covered with a mask (silicon oxide film), and then phosphorus (P) is doped into a portion of the crystalline silicon film. Next, heat treatment is performed under a nitrogen atmosphere at 600° C. for 12 hours.

After removing the mask, patterning is performed to remove the unnecessary portions of the crystalline silicon film, thereby forming a semiconductor layer 404. (see FIG. 8C(1)) Note that a top view of the pixel after the formation of the semiconductor layer 404 is shown in FIG. 8C(2). The sectional view cut along the broken line A-A' in FIG. 8C(2) corresponds to FIG. 8C(1).

Figure 9A:
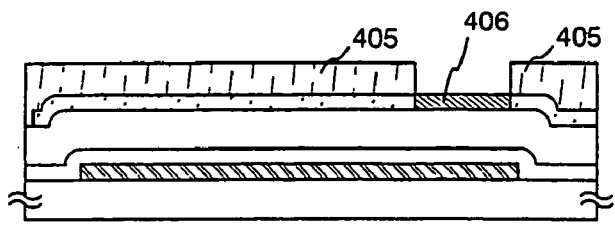

A mask 405 is formed next, and then phosphorus is doped into a portion of the semiconductor layer (a region as the storage capacitor) 406 to form the storage capacitor. (see FIG. 9A).

Figure 9B:
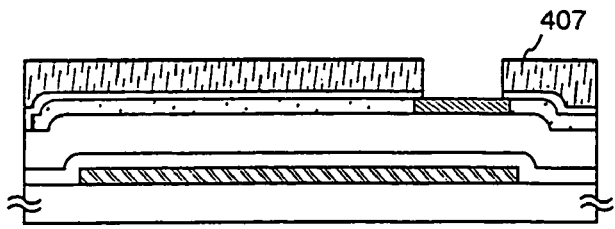

Then the mask 405 is removed, and after forming an insulating film for covering the semiconductor layer, a mask 407 is formed. The insulating film on the region 406 as the storage capacitor is then removed. (See FIG. 9B).

Thereafter, the mask 407 is removed and thermal oxidation is conducted to form an insulating film 408a (gate insulating film). Through thermal oxidation, the final film thickness of the gate insulating film became 80 nm. Note that an insulating film 408b is formed thinner than those of other regions on the region as the storage capacitor. (see FIG. 9C(1)) A top view of the pixel at this stage is shown in FIG. 9C(2). In FIG. 9C(2), the sectional view cut along the broken line B-B' corresponds to FIG. 9C(1). Further, the region shown inside the dashed line in FIGS. 9C(1) and (2) are portions in which the thin insulating film 408b is formed.

A channel dope process for doping an impurity element that imparts a p-type or an n-type conductivity at a low concentration into a region that is to become a channel forming region of the TFT is performed on the entire surface or selectively. The channel dope process is a process for controlling the threshold voltage of the TFT. Note that diborane ($B_2H_6$) is not mass separated but boron is doped by a plasma excited ion dope method. Of course, the ion implantation method may be employed to perform mass separation.

Next, a mask 409 is formed on the insulating film 408a and the insulating films 403a and 403b to thereby form a contact hole to reach the scanning line 402. (see FIG. 10A) Then the mask is removed after the formation of the contact hole.

A conductive film is formed next, and then patterning is performed to form a gate electrode 410 and a capacitor wiring 411. (see FIG. 10B) A laminated structure of a silicon film (having a film thickness of 150 nm) and a tungsten silicide film (having a film thickness of 150 nm), which have been doped with phosphorus, is used here. It is to be noted that the storage capacitor, with the insulating film 408b as a dielectric, is composed of the capacitor wiring 411 and the portion 406 of the semiconductor layer.

Then phosphorus is doped at low concentration in a self-aligning manner using the gate electrode 410 and the capacitor wiring 411 as a mask. (see FIG. 10C(1)) A top view of the pixel at this stage is shown in FIG. 10C(2). In FIG. 10C(2), the sectional view cut along the broken line C-C' corresponds to FIG. 10C(1). The phosphorus concentration of this region doped at low concentration is adjusted so that it becomes $1\times10^{16}$ to $5\times10^{18}$ atoms/cm$^3$, typically $3\times10^{17}$ to $3\times10^{18}$ atoms/cm$^3$.

A mask 412 is formed next, and phosphorus is doped at a high concentration, thereby forming a high concentration impurity region 413 that is to become a source region or a drain region. (see FIG. 11A) The phosphorus concentration of this high concentration impurity region is adjusted so that it becomes $1\times10^{20}$ to $1\times10^{21}$ atoms/cm$^3$, (typically $2\times10^{20}$ to $5\times10^{20}$ atoms/cm$^3$). Note that a region of the semiconductor layer 404 which overlaps with the gate electrode 410 becomes a channel forming region 414 and a region of the semiconductor layer 404 which is covered by the mask 412 becomes a low concentration impurity region 415 functioning as an LDD region. Then the mask 412 is removed after doping an impurity element.

Although not shown in the figure, in order to form a p-channel TFT utilized in a driver circuit that is formed on the same substrate as the pixel, a region that is to become an n-channel TFT is covered with a mask and then doped with boron to form a source region or a drain region.

A passivation film 416 is formed next to cover the gate electrode 410 and the capacitor wiring 411 after removing the mask 412. A silicon oxide film formed to a thickness of 70 nm is used for the passivation film here. Next, heat treatment is performed to activate the impurity element that imparts a p-type conductivity or an n-type conductivity doped at respective concentrations into the semiconductor layer. Heat treatment is performed at 850° C. for 30 minutes.

Next, an interlayer insulating film 417 made of an organic resin material is formed. An acrylic resin film formed to a thickness of 400 nm is used here. Then an electrode 418 and a source wiring 419 are formed after forming a contact hole to reach the semiconductor layer. In Embodiment 4, the electrode 418 and the source wiring 419 are used for a laminated film of a three-layered structure composed of a 100 nm Ti film, a 300 nm aluminum film containing Ti, and a 150 nm Ti film which are formed in succession by sputtering (FIG. 11B(1)). In FIG. 11B(2), the sectional view cut along the broken line D-D' corresponds to FIG. 11B(1).

Then after performing the hydrogenation process, an interlayer insulating film 420 made of acrylic is formed (FIG. 12A(1)). A 100 nm conductive film having light shielding characteristics is formed on the interlayer insulating film 420, to thereby form a light shielding layer 421. Following this, an interlayer insulating film 422 is formed, and then a contact hole is formed to reach the gate electrode 418. A 100 nm transparent conductive film (here it is an indium tin oxide (ITO) film) is formed and patterned to form pixel electrodes 423 and 424. In FIG. 12A(2), the sectional view cut along the broken line E-E' corresponds to FIG. 12A(1).

Accordingly, in the pixel portion, a surface area of the display region (pixel size 26 μm×26 μm) (aperture ration of 76.5%) can be secured, while the pixel TFT, which is formed from the n-channel TFT, is formed, and a sufficient storage capacitor (51.5 fF) can be obtained.

Note that Embodiment 4 is an example, and therefore, needless to say, the present invention is not limited to the process of this Embodiment. For example, a film formed from an element selected from the group consisting of tantalum (Ta), titanium (Ti), molybdenum (Mo), tungsten (W), chrome (Cr) and silicon (Si), or from an alloy film of a combination of these elements (typically Mo—W alloy and Mo—Ta alloy) can be used as the respective conductive films. Furthermore, a silicon oxide film, a silicon nitride film, a silicon oxynitride film, and a film made of an organic resin material (such as polyimide, acrylic, polyamide, polyimide amide, and BCB (benzocyclobutene)) can be used as the respective insulating films.

Figure 13:
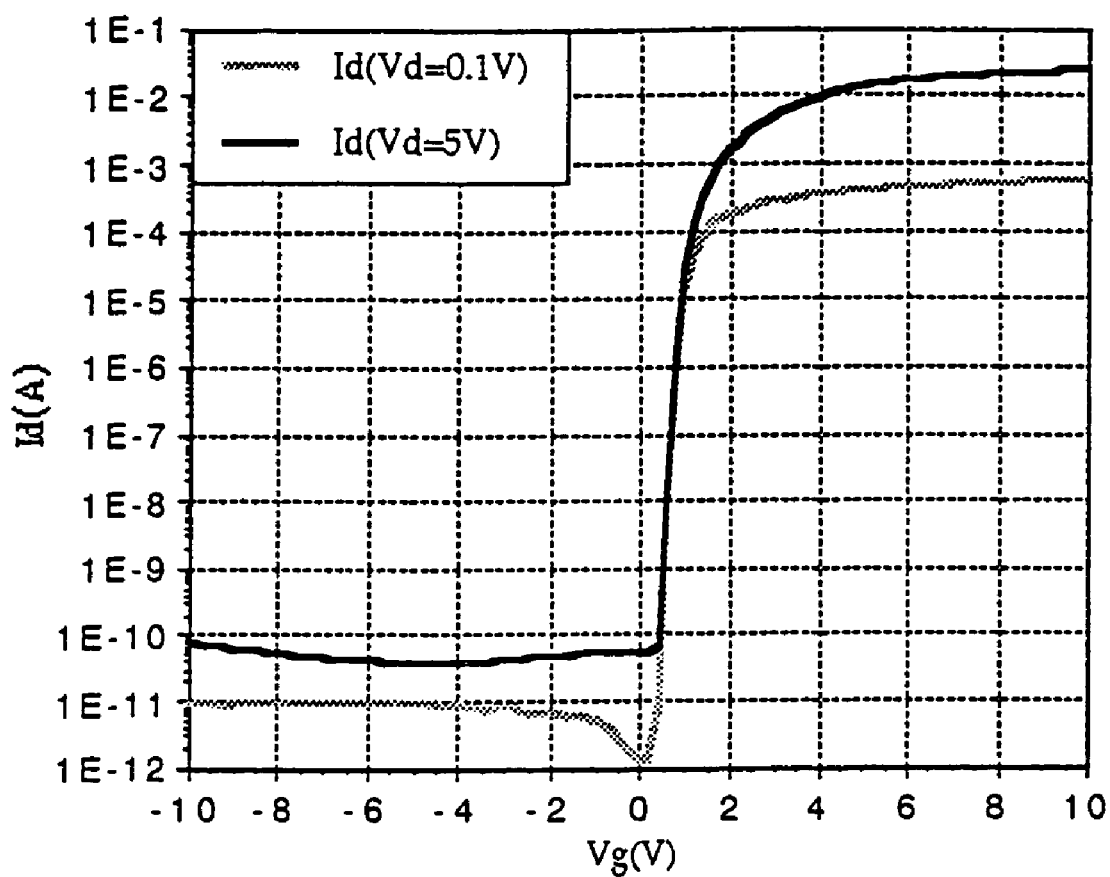
FIG. 13 is a graph illustrating a TFT characteristic.

The characteristic of the TFT thus obtained showed a satisfactory value. The TFT characteristic (V-I characteristic) is shown in FIG. 13. An S-value shows an excellent value of 105.8 (mV/dec) since, particularly, the structure of the present invention is a dual gate structure. In addition, by fabricating the structure of the present invention, a threshold value (Vth) that indicates a voltage value at the starting point in the V-I characteristic graph is 0.946 V in the case of Vd=0.1 V and 0.886 V in the case of Vd=5 V. Thus, there is a difference of 0.06 which is extremely small. It can be said that the smaller the difference is, the more short-channel effect is suppressed. Further, a mobility ($\mu_{FE}$) shows an excellent value of 220 (cm$^2$/Vs).

Embodiment 5

Embodiment 5 is characterized in that a scanning line 502a is formed on a different layer from a gate electrode, and furthermore, a capacitor electrode 502b is formed on the same layer as the scanning line 502a in order to increase the aperture ratio as well as enlarge the storage capacitor. An example of the pixel structure of the present invention is shown in FIG. 14 and FIGS. 15A and 15B.

Figure 14:
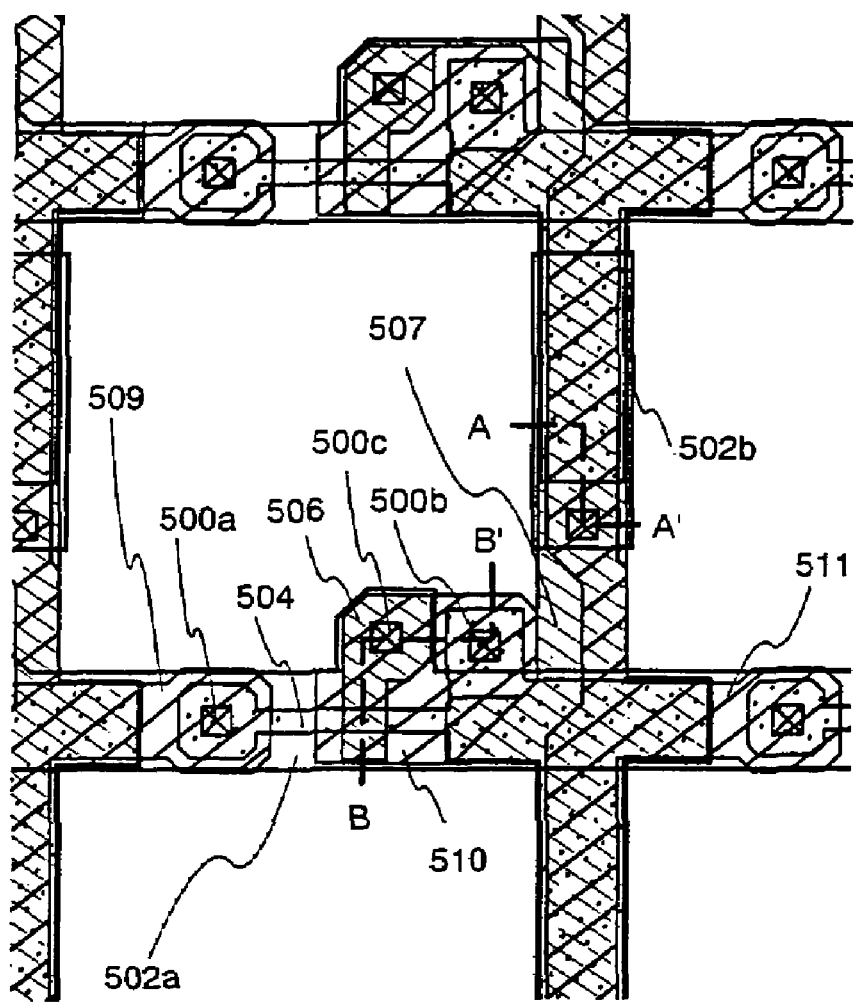
FIG. 14 is a diagram showing a top view of a pixel.

Note that the schematic cross-sectional structural views cut along the broken lines A-A' and B-B' in FIG. 14 correspond to FIGS. 15A and 15B, respectively.

In FIG. 14, a gate electrode 506 patterned into an island shape is connected to a scanning line 502a through a contact hole 500c formed at an insulating film. Further, a semiconductor film 504 is connected to a signal line 509 through a contact hole 500a. In addition, the semiconductor film 504 is connected to an electrode 510 through a contact hole 500b. A region of the semiconductor film that is connected to the signal line 509 or to the electrode 510 is referred to as a source region or a drain region. Further, a channel forming region is formed between the source region and the drain region, and the gate electrode 506 is present on the channel forming region through a gate insulating film. Note that the source region, the drain region, and the channel forming region are not shown in the figure for simplification.

In Embodiment 5, in the case of forming the scanning lines 502a on the lower layer of the gate electrode 506 as shown in FIG. 14, the scanning line 502a will be provided on the lower layer of the semiconductor film 504, thus it is made possible to function as a light shielding film. In addition, the storage capacitor is formed with a lower electrode as the semiconductor film, an insulating film covering the semiconductor film as a dielectric, and a upper electrode as a capacitor wiring 507. It is to be noted that the storage capacitor may be enlarged by partially thinning the insulating film which covers the semiconductor film.

Further, the storage capacitor of Embodiment 5 can also be formed with the capacitor electrode 502b connected to the capacitor wiring 507, with the insulating film 503 as a dielectric, as shown in FIGS. 15A and 15B. Accordingly, the storage capacitor can be efficiently secured and contrast of a liquid crystal display device utilizing this pixel structure can be improved. It is noted that reference numeral 501 denotes a substrate, 502 denotes a gate insulating film (second insulating film), 508 denotes a third insulating film, and 511 denotes a signal line.

According to the structure of Embodiment 5, the TFTs of each pixel can be a dual gate structure in which a gate electrode is provided on the upper and lower parts of the channel forming region through an insulating film, and the parasitic capacitance formed by the scanning line and another wiring can be restrained while improving the characteristics of the TFTs by setting the film thickness of the first insulating appropriately.

A method of manufacturing the pixel structure shown in Embodiment 5 is nearly the same as that of Embodiment 1 or 4, and therefore descriptions thereof are omitted here.

It is to be noted that Embodiment 5 can be freely combined with any one of structures described in Embodiments 1 to 4.

Embodiment 6

Embodiment 6 discloses to increase the aperture ratio as well as enlarge the storage capacitor in case of decreasing a pixel size. In particular, the present embodiment is characterized in that the storage capacitor is formed of the light shielding film and the pixel electrode.

Figure 16:
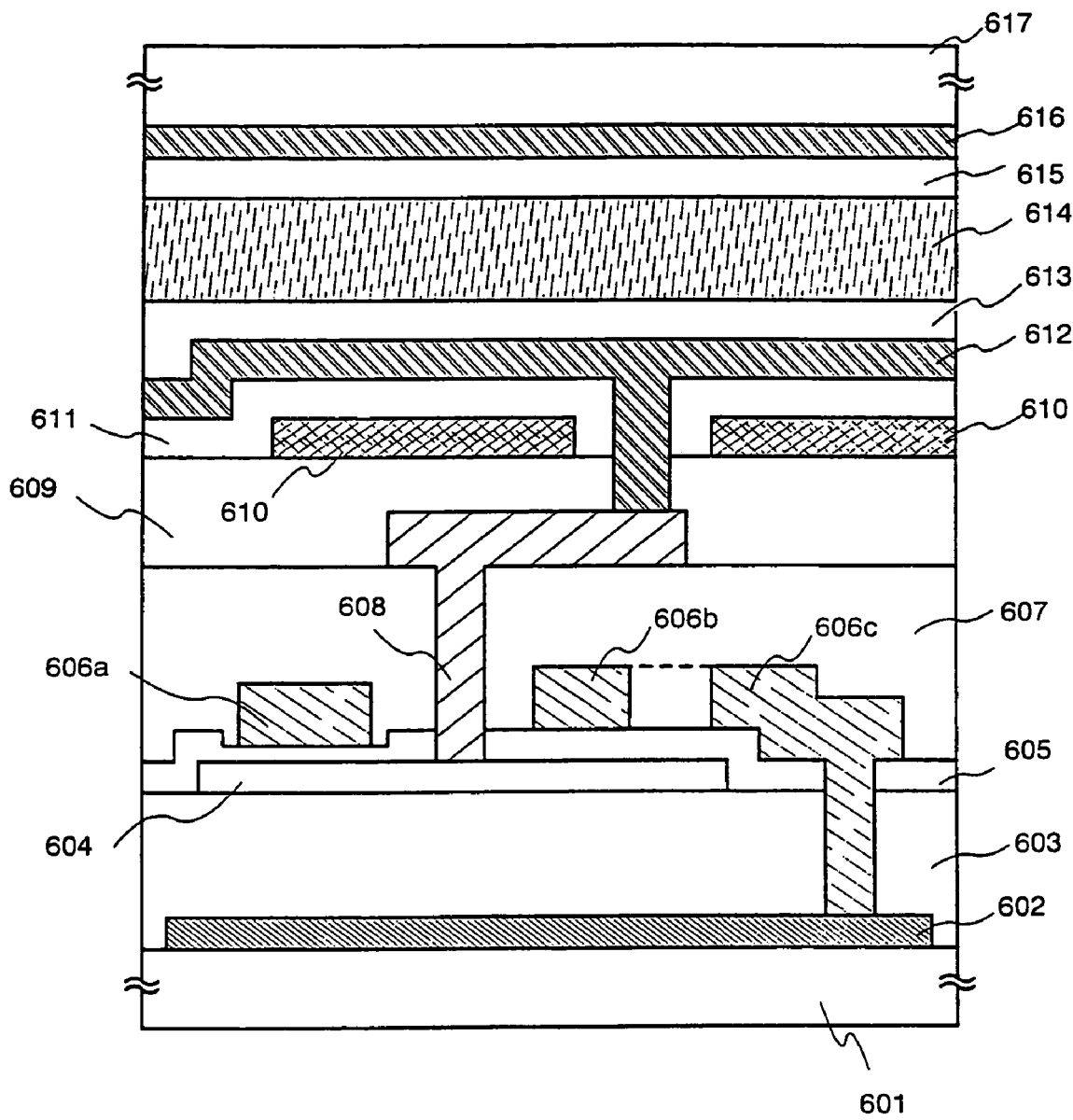
FIG. 16 is a diagram showing cross-sectional view of a pixel structure.

FIG. 16 is a cross sectional view showing the liquid crystal display device of the present embodiment. Reference numeral 601 denotes a substrate (TFT substrate), 602 denotes a scanning line, 603 denotes a first insulating film, 604 denotes a semiconductor film, 605 denotes a gate insulating film (second insulating film), 606b denotes a gate electrode, 606c denotes a gate wiring, 606a denotes a capacitor wiring, 607 denotes a third insulating film, 608 denotes an electrode for connecting the pixel electrode 612 and the TFT through a contact hole formed in the third insulating film.

Reference numeral 609 denotes a fourth insulating film covering the TFT, 610 denotes a light shielding film preventing the TFT from distortion by light, 611 denotes a fifth insulating film, 612 denotes a pixel electrode connected to the electrode 608 through a contact hole, and 613 denotes an alignment film for orienting liquid crystal layer 614.

In FIG. 16, an opposing electrode 616 and an alignment film 615 are provided on the opposing substrate 617. A light shielding film or a color filter may be further provided on the opposing substrate 617.

As shown in FIG. 16, the storage capacitor of the present embodiment is constructed by first storage capacitor formed of the capacitor wiring 606a, semiconductor film 604, and the insulating film 605 as a dielectric, and second storage capacitor formed of the light shielding film 610, pixel electrode 612, and the insulating film 611 as a dielectric. It is noted that the insulating film 611 may be an organic resin film, or a inorganic insulating film such as silicon oxynitride and silicon oxide, etc. And the thickness of the insulating film may be appropriately decided by the operator.

Figure 17A:
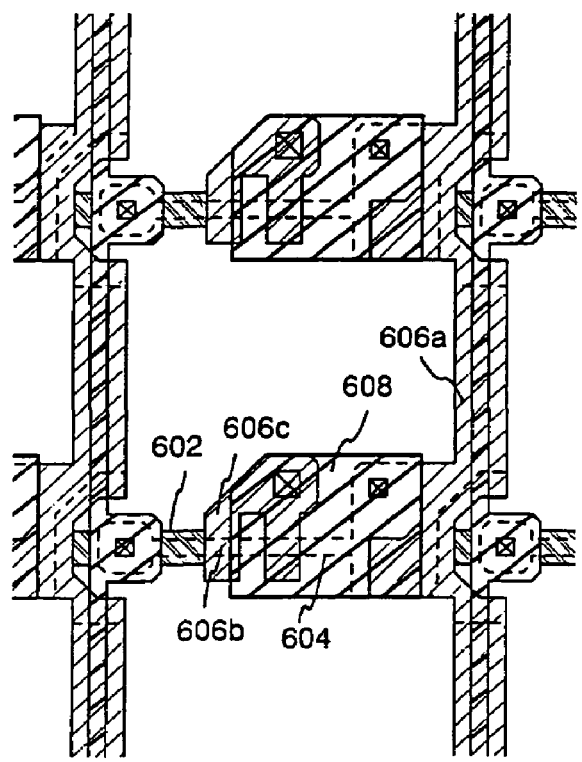
FIGS. 17A and 17B are is a diagram showing a top view of a pixel.
Figure 17B:
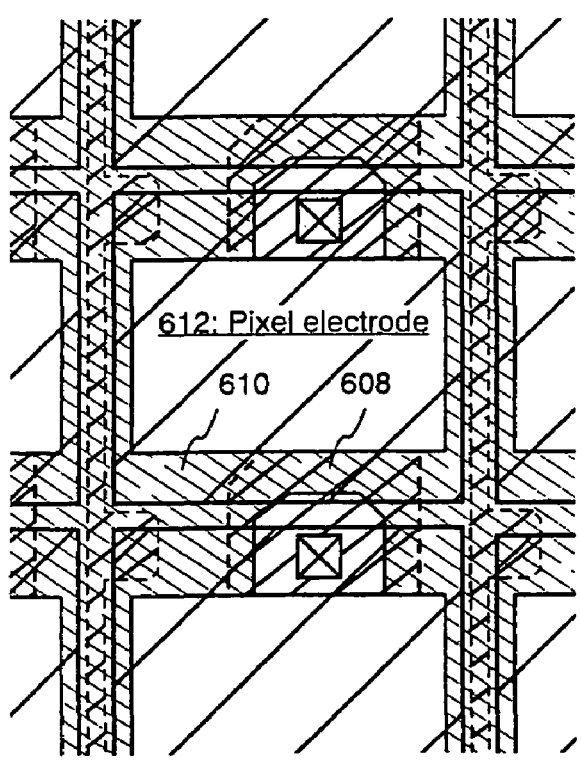

For example, even if the pixel size is set to 14 μm×14 μm, enough storage capacitor (about 100 fF), and an aperture ratio of 48.8% can be secured by constructing the pixel electrode as shown in FIG. 17B.

FIG. 17A denotes a top view at the step of forming an electrode 608, and FIG. 17B is a top view at the step of forming the light shielding film 610 and the pixel electrode 612. The same reference numerals are used at the part corresponding to FIG. 16.

It is to be noted that Embodiment 6 can be freely combined with any one of structures described in Embodiments 1 to 5.

According to the present invention, a region (the region that corresponds to the A region in FIG. 19) that was conventionally used as a wiring region within the scanning line and the scanning line/capacitor wiring segregation region can be used as the storage capacitor. Further, by structuring the plurality of pixels connected to the respective scanning lines thereby being connected to the individually independent capacitor wiring, signal writing-in can be performed continuously to each pixel and the neighboring pixel, and even in the case of performing the above signal writing-in, each pixel does not receive the influence of the writing-in electric current of the neighboring pixel. In addition, the electric load of the respective capacitor wirings is dispersed in a timely manner, thereby reducing the effective load. Thus, the demand for the capacitor wiring resistance is alleviated.

Consequently, according to the liquid crystal display device employing the present invention, a liquid crystal display element having both a high aperture ratio and respective pixels having therein storage capacitors which hold sufficient display signal electric potential is obtained. Accordingly, satisfactory image display can be obtained while attaining small scale and power-saving devices.

What is claimed is:

1. A display device comprising a pixel portion, the pixel portion comprising:
   a first wiring formed on an insulating surface;
   a first insulating film formed on the first wiring;
   a semiconductor film formed on the first insulating film;
   a second insulating film formed on the semiconductor film;
   a gate electrode formed on the second insulating film, and electrically connected to the first wiring;
   a third insulating film formed over the gate electrode; and
   a signal line formed over the third insulating film, and electrically connected to the semiconductor film.

2. A display device comprising a pixel portion, the pixel portion comprising:
   a first wiring formed on an insulating surface;
   a first insulating film formed on the first wiring;
   a semiconductor film formed on the first insulating film;
   a second insulating film formed on the semiconductor film;

a gate electrode formed on the second insulating film, and electrically connected to the first wiring;
a capacitor wiring formed over the second insulating film;
a third insulating film formed over the gate electrode; and
a signal line formed over the third insulating film, and electrically connected to the semiconductor film.

3. A display device comprising a pixel portion, the pixel portion comprising;
a first wiring formed on an insulating surface;
a first insulating film formed on the first wiring;
a semiconductor film formed on the first insulating film;
a second insulating film formed on the semiconductor film;
a gate electrode formed on the second insulating film, and electrically connected to the first wiring;
a third insulating film formed over the gate electrode;
a signal line formed over the third insulating film, and electrically connected to the semiconductor film;
a fourth insulating film formed over the signal line; and
a light shielding film formed over the fourth insulating film.

4. A display device comprising a pixel portion, the pixel portion comprising:
a first wiring formed on an insulating surface;
a first insulating film formed on the first wiring;
a semiconductor film formed on the first insulating film;
a second insulating film formed on the semiconductor film;
a gate electrode formed on the second insulating film, and electrically connected to the first wiring;
a third insulating film formed over the gate electrode;
a signal line formed over the third insulating film, and electrically connected to the semiconductor film;
a fourth insulating film formed over the signal line; and
a pixel electrode formed over the fourth insulating film.

5. A display device comprising a pixel portion, the pixel portion comprising:
a first wiring formed on an insulating surface;
a first insulating film formed on the first wiring;
a semiconductor film formed on the first insulating film;
a second insulating film formed on the semiconductor film;
a gate electrode formed on the second insulating film, and electrically connected to the first wiring;
a capacitor wiring formed over the second insulating film;
a third insulating film formed over the gate electrode;
a signal line formed over the third insulating film, and electrically connected to the semiconductor film;
a fourth insulating film formed over the signal line; and
a pixel electrode formed over the fourth insulating film.

6. A display device comprising a pixel portion, the pixel portion comprising:
a first wiring formed on an insulating surface;
a first insulating film formed on the first wiring;
a semiconductor film formed on the first insulating film;
a second insulating film formed on the semiconductor film;
a gate electrode formed on the second insulating film, and electrically connected to the first wiring;
a third insulating film formed over the gate electrode;
a signal line formed over the third insulating film, and electrically connected to the semiconductor film;
a fourth insulating film formed over the signal line;
a light shielding film formed over the fourth insulating film;
a fifth insulating film formed over the light shielding film; and
a pixel electrode formed over the fifth insulating film.

7. A display device according to any one of claims 1 to 6, wherein the first wiring comprises a gate wiring.

8. A display device according to any one of claims 1 to 6, wherein the second insulating film comprises a gate insulating film.

9. A display device according to claim 8, wherein the gate insulating film comprises a thermal oxidation film.

10. A display device according to any one of claims 1 to 6, wherein the third insulating film comprises at least one selected from the group consisting of silicon oxide, silicon nitride, and silicon oxynitride.

11. A display device according to any one of claims 3 to 6, wherein the fourth insulating film comprises at least one selected from the group consisting of an organic insulating material, silicon oxide, silicon nitride, and silicon oxynitride.

12. A display device according to claim 6, wherein the fifth insulating film comprises an organic insulating material.

13. A display device according to any one of claims 2 and 5, wherein the capacitor wiring is in contact with the second insulating film.

14. A display device according to any one of claims 1 to 6, wherein the display device is a liquid crystal display device.

15. A display device according to any one of claims 1 to 6, wherein the display device is incorporated in at least one selected from the group consisting of a personal computer, a video camera, a mobile computer, a goggle type display, a player using a recording medium, and a digital camera.

16. A display device comprising a pixel portion, the pixel portion comprising;
a scanning line formed over a substrate;
a semiconductor film formed over the scanning line, wherein the semiconductor film includes a source region, a drain region, a channel forming region, and a region to be a lower electrode for a storage capacitor;
a gate electrode formed over the channel forming region;
an upper electrode for the storage capacitor formed over the lower electrode; and
a signal line formed over the gate electrode and the upper electrode,
wherein the lower electrode has a first portion in parallel with and overlapped with the signal line, and has a second portion in parallel with and overlapping the scanning line, and
wherein the upper electrode has a third portion in parallel with and overlapped with the signal line, and has a fourth portion in parallel with and overlapping the scanning line.

17. A display device comprising a pixel portion, the pixel portion comprising:
a scanning line formed over a substrate;
a semiconductor film formed over the scanning line, wherein the semiconductor film includes a source region, a drain region, a channel forming region, and a region to be a lower electrode for a storage capacitor, and wherein the source region, the drain region and the channel forming region overlap the scanning line;
a gate electrode formed over the channel forming region;
an upper electrode for the storage capacitor formed over the lower electrode; and
a signal line formed over the gate electrode and the upper electrode,
wherein the lower electrode has a first portion in parallel with and overlapped with the signal line, and has a second portion in parallel with and overlapping the scanning line, and
wherein the upper electrode has a third portion in parallel with and overlapped with the signal line, and has a fourth portion in parallel with and overlapping the scanning line.

18. A display device comprising a pixel portion, the pixel portion comprising:

a scanning line formed over a substrate;

a semiconductor film formed over the scanning line, wherein the semiconductor film includes a source region, a drain region, a channel forming region, and a region to be a lower electrode for a storage capacitor;

a gate electrode formed over the channel forming region;

an upper electrode for the storage capacitor formed over the lower electrode;

a signal line formed over the gate electrode and the upper electrode; and a light shielding film formed over the signal line, wherein the light shielding film overlaps the semiconductor film, wherein the lower electrode has a first portion in parallel with and overlapped with the signal line, and has a second portion in parallel with and overlapping the scanning line, and wherein the upper electrode has a third portion in parallel with and overlapped with the signal line, and has a fourth portion in parallel with and overlapping the scanning line.

19. A display device according to any one of claims 16 to 18, wherein the gate electrode contains at least one selected from the group consisting of poly-Si, W, $WSi_x$, Al, Ta, Cr, and Mo.

20. A display device according to any one of claims 16 to 18, wherein the upper electrode for the storage capacitor contains at least one selected from the group consisting of poly-Si, W, $WSi_x$, Al, Ta, Cr, and Mo.

21. A display device according to any one of claims 16 to 18, wherein the scanning line contains at least one selected from the group consisting of poly-Si, W, $WSi_x$, Al, Ta, Cr, and Mo.

22. A display device according to any one of claims 16 to 18, wherein the signal line contains at least one selected from the group consisting of Al, W, Ti, and TiN.

23. A display device according to any one of claims 16 to 18, wherein the display device is a liquid crystal display device.

24. A display device according to any one of claims 16 to 18, wherein the display device is incorporated in at least one selected from the group consisting of a personal computer, a video camera, a mobile computer, a goggle type display, a player using a recording medium, and a digital camera.

* * * * *